US012647071B2

(12) United States Patent
Lin et al.

(10) Patent No.: US 12,647,071 B2
(45) Date of Patent: *Jun. 2, 2026

(54) VOLTAGE CONTROLLED OSCILLATOR AND METHOD

(71) Applicant: TAIWAN SEMICONDUCTOR MANUFACTURING COMPANY, LTD., Hsinchu (TW)

(72) Inventors: Chi-Hsien Lin, Hsinchu (TW); Ho-Hsiang Chen, Hsinchu (TW); Hsien-Yuan Liao, Hsinchu (TW); Tzu-Jin Yeh, Hsinchu (TW); Ying-Ta Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/886,420

(22) Filed: Sep. 16, 2024

(65) Prior Publication Data

US 2025/0007459 A1 Jan. 2, 2025

Related U.S. Application Data

(60) Continuation of application No. 18/362,925, filed on Jul. 31, 2023, now Pat. No. 12,095,419, which is a
(Continued)

(51) Int. Cl.
*H03B 5/12* (2006.01)
*H03B 1/04* (2006.01)
*H03H 7/01* (2006.01)
(52) U.S. Cl.
CPC ............. *H03B 5/1228* (2013.01); *H03B 1/04* (2013.01); *H03B 5/1203* (2013.01);
(Continued)

(58) Field of Classification Search
CPC .. H03B 5/1228; H03B 5/1026; H03B 5/1212; H03B 5/1243; H03B 5/1296; H03B 2200/009; H03B 2200/034; H03B 1/04
See application file for complete search history.

(56) References Cited

U.S. PATENT DOCUMENTS 3,315,178 A 4/1967 Chernish
6,621,365 B1 9/2003 Hallivuori et al.
(Continued)

FOREIGN PATENT DOCUMENTS

CN 104272583 1/2015
CN 205509976 8/2016
(Continued)

OTHER PUBLICATIONS

Babaie, Masoud et al.; "A Class-F CMOS Oscillator," IEEE Journal of Solid-State Circuits, vol. 48 Issue No. 12, pp. 3120-3133, Dec. 2013. (pp. 1-15) DOI: 10.1109/JSSC.2013.2273823.
(Continued)

*Primary Examiner* — Jeffrey M Shin
(74) *Attorney, Agent, or Firm* — Hauptman Ham, LLP

(57) ABSTRACT

A voltage-controlled oscillator (VCO) includes a power supply source, a voltage source, a reference voltage node, first and second transistors, each including a source terminal coupled to the reference voltage node, and first through fourth conductive structures. The first conductive structure includes a first terminal coupled to the power supply source, a first extending portion coupled between the first terminal and a drain terminal of the first transistor, and a second extending portion coupled between the first terminal and a drain terminal of the second transistor, and the second conductive structure includes a second terminal coupled to the voltage source, a third extending portion coupled in series with the third conductive structure between the second terminal and a gate of the first transistor, and a fourth
(Continued)

extending portion coupled in series with the fourth conductive structure between the second terminal and a gate of the second transistor.

20 Claims, 26 Drawing Sheets

Related U.S. Application Data continuation of application No. 17/732,400, filed on Apr. 28, 2022, now Pat. No. 11,736,064, which is a continuation of application No. 17/231,245, filed on Apr. 15, 2021, now Pat. No. 11,323,068, which is a division of application No. 16/731,454, filed on Dec. 31, 2019, now Pat. No. 10,992,262, which is a continuation-in-part of application No. 16/432,004, filed on Jun. 5, 2019, now Pat. No. 10,931,230.

(60) Provisional application No. 62/943,744, filed on Dec. 4, 2019, provisional application No. 62/691,928, filed on Jun. 29, 2018.

(52) U.S. Cl.
CPC ......... *H03B 5/1206* (2013.01); *H03B 5/1212* (2013.01); *H03B 5/1243* (2013.01); *H03B 5/1296* (2013.01); *H03H 7/0161* (2013.01); *H03B 2200/009* (2013.01)

(56) References Cited

U.S. PATENT DOCUMENTS

| | | | |
|---|---|---|---|
| 8,742,880 | B2 | 6/2014 | Kim et al. |
| 10,931,230 | B2 | 2/2021 | Lin et al. |
| 11,323,068 | B2 | 5/2022 | Lin et al. |
| 11,736,064 | B2 * | 8/2023 | Lin ...................... H03B 5/1253 |
| | | | 331/117 FE |
| 12,095,419 | B2 * | 9/2024 | Lin ...................... H03H 7/0161 |
| 2003/0095458 | A1 | 5/2003 | Park et al. |
| 2003/0141953 | A1 | 7/2003 | Haslett et al. |
| 2006/0181355 | A1 | 8/2006 | Copani et al. |
| 2007/0279139 | A1 | 12/2007 | El Rai et al. |
| 2008/0111644 | A1 | 5/2008 | Jang et al. |
| 2008/0143446 | A1 | 6/2008 | Yao et al. |
| 2008/0174375 | A1 | 7/2008 | Nakamura et al. |
| 2008/0231383 | A1 | 9/2008 | Chang et al. |
| 2009/0261876 | A1 | 10/2009 | Zhan |
| 2010/0207695 | A1 | 8/2010 | Bao |
| 2010/0248647 | A1 | 9/2010 | Wachi |
| 2011/0018645 | A1 | 1/2011 | Chang et al. |
| 2011/0032044 | A1 | 2/2011 | Lee et al. |
| 2011/0102093 | A1 | 5/2011 | El Rai et al. |
| 2014/0292419 | A1 | 10/2014 | Ragonese et al. |
| 2014/0320215 | A1 | 10/2014 | Staszewski et al. |
| 2017/0201223 | A1 | 7/2017 | Aboush |
| 2018/0131323 | A1 | 5/2018 | Shu et al. |
| 2019/0068201 | A1 | 2/2019 | Li et al. |

FOREIGN PATENT DOCUMENTS

| | | |
|---|---|---|
| CN | 107968630 | 4/2018 |
| CN | 108123702 | 6/2018 |
| CN | 109302146 | 2/2019 |
| TW | 201012047 | 3/2010 |
| TW | 201037963 | 10/2010 |
| TW | 201242237 | 10/2012 |

OTHER PUBLICATIONS

Office Action dated Aug. 10, 2021 for corresponding case No. TW 11020772950. (pp. 1-4).
Office Action dated Jan. 4, 2022 for corresponding case No. TW 11120008810. (pp. 1-6).

* cited by examiner $P_{D1} + m_2 P_{D2} = P_{G1}$

If $P_{D1} = P_{D2}$ and $m_1 = m_2 = 2$ $P_{G1} = 3 P_{D1}$ $10 \log(1/3) \approx -4.8$

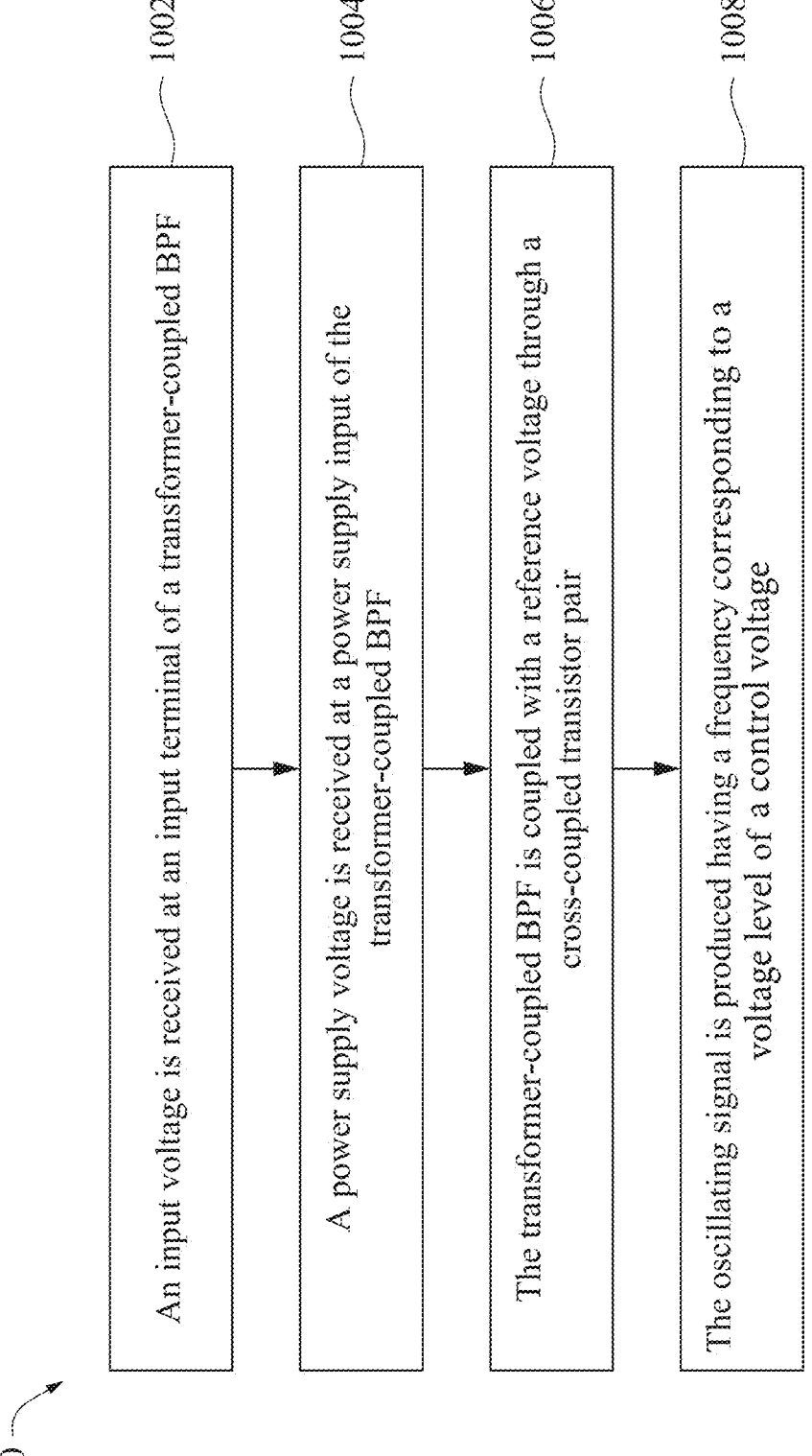

1002 — An input voltage is received at an input terminal of a transformer-coupled BPF 1004 — A power supply voltage is received at a power supply input of the transformer-coupled BPF 1006 — The transformer-coupled BPF is coupled with a reference voltage through a cross-coupled transistor pair 1008 — The oscillating signal is produced having a frequency corresponding to a voltage level of a control voltage

Figure 22:
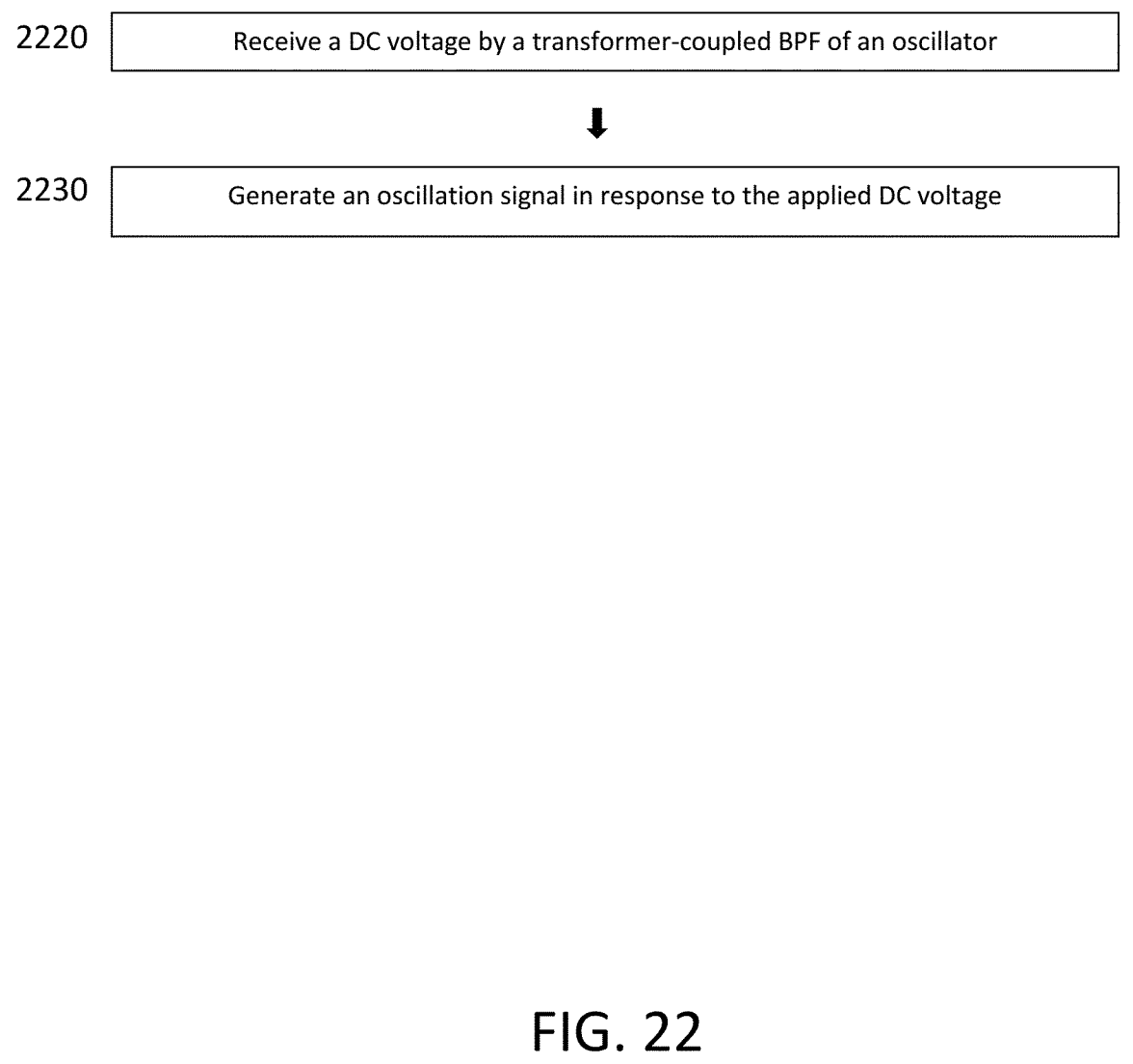

2220 | Receive a DC voltage by a transformer-coupled BPF of an oscillator

↓

2230 | Generate an oscillation signal in response to the applied DC voltage

VOLTAGE CONTROLLED OSCILLATOR AND METHOD

PRIORITY CLAIM AND CROSS-REFERENCE

This application is a continuation of U.S. patent application Ser. No. 18/362,925, filed Jul. 31, 2024, now U.S. Pat. No. 12,095,419, issued Sep. 17, 2024, which is a continuation of U.S. patent application Ser. No. 17/732,400, filed Apr. 28, 2022, now U.S. Pat. No. 11,736,064, issued Aug. 22, 2023, which is a continuation of U.S. patent application Ser. No. 17/231,245, filed Apr. 15, 2021, now U.S. Pat. No. 11,323,068, issued May 3, 2022, which is a divisional of U.S. patent application Ser. No. 16/731,454, filed Dec. 31, 2019, now U.S. Pat. No. 10,992,262, issued Apr. 27, 2021, which claims priority of U.S. Provisional Patent Application, Ser. No. 62/943,744, filed Dec. 4, 2019, and is a continuation-in-part of U.S. patent application Ser. No. 16/432,004, filed Jun. 5, 2019, now U.S. Pat. No. 10,931,230, issued Feb. 23, 2021, which claims priority of U.S. Provisional Patent Application, Ser. No. 62/691,928, filed Jun. 29, 2018, each of which is incorporated herein by reference in its entirety.

BACKGROUND

Integrated circuits (ICs) sometimes include one or more oscillator circuits that generate signals having frequencies ranging from a few hertz to hundreds of gigahertz (GHz). The frequencies depend on circuit design and, in some cases, one or more circuit input signal values. A voltage controlled oscillator (VCO) is an oscillator with an output signal whose output can be varied over a range, which is controlled by an input voltage. The output frequency of the output signal of the oscillator is directly related to the input voltage. By varying the input voltage, the output frequency of the output signal is adjusted.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

2

Figure 8B:
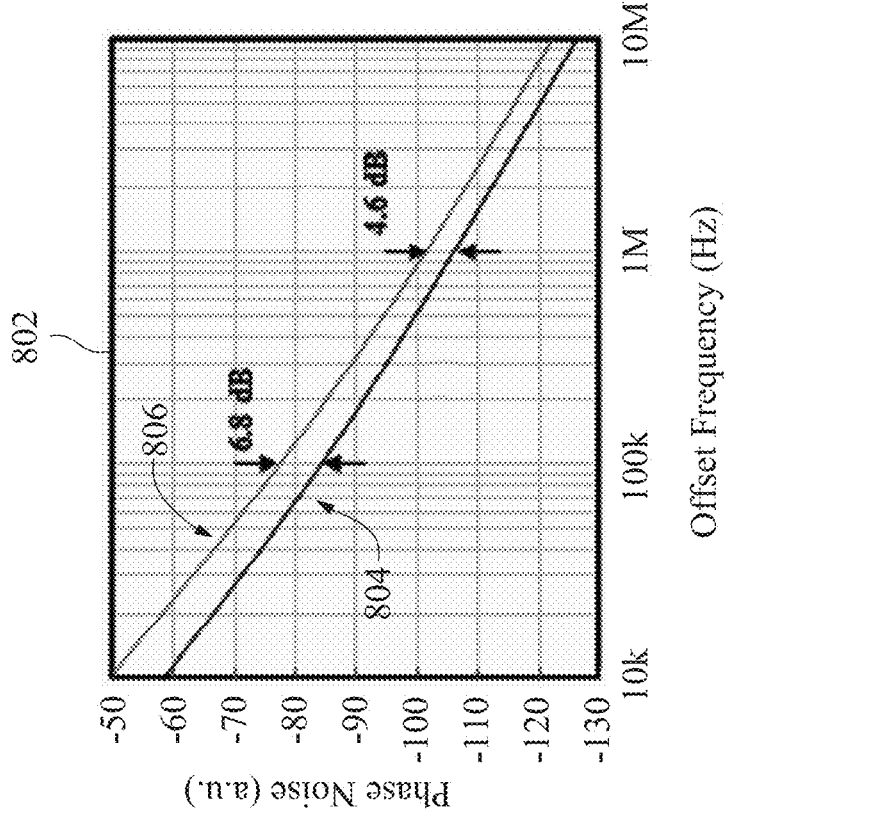
Figure 8A:
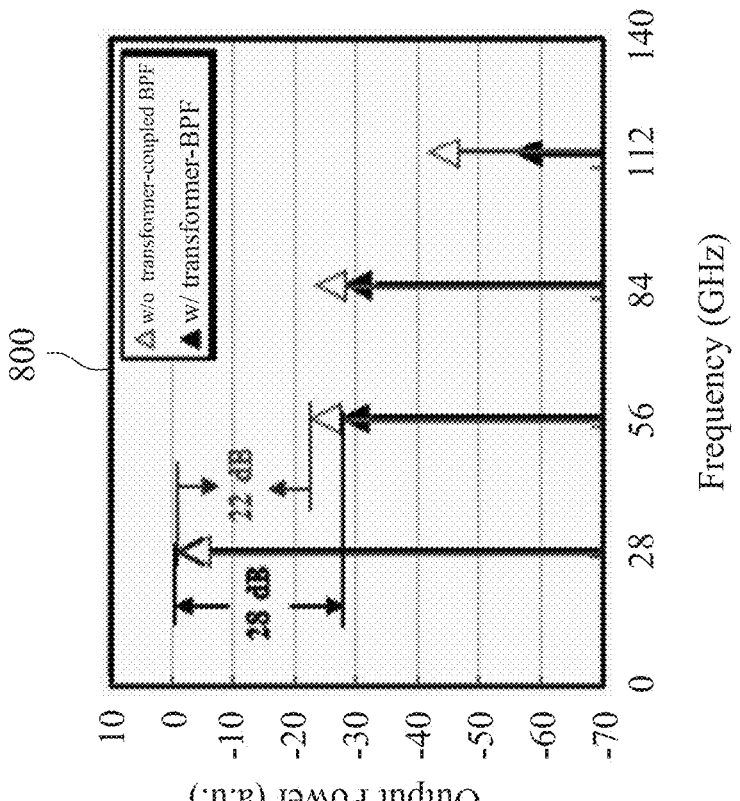

FIGS. 8A-8B are graphs of the noise suppression of a VCO, in accordance with some embodiments.

Figure 9B:
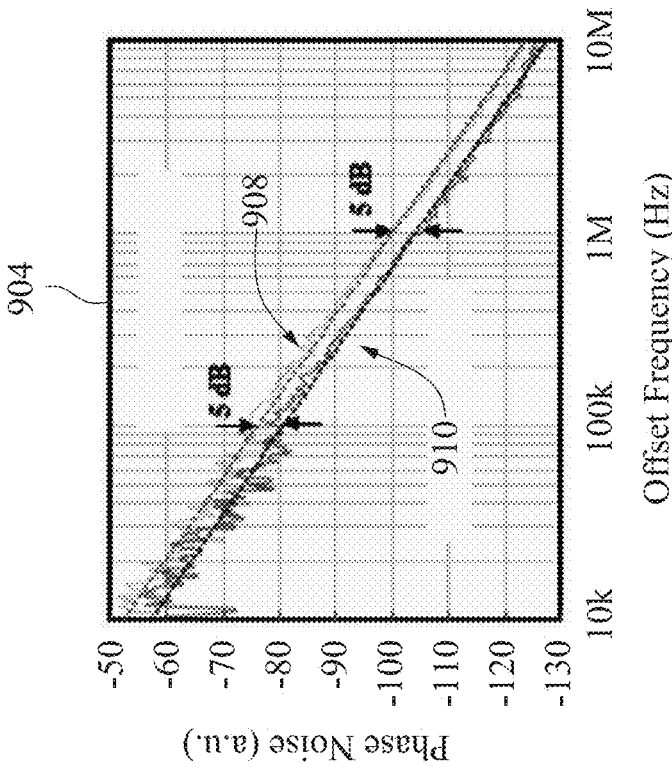
Figure 9A:
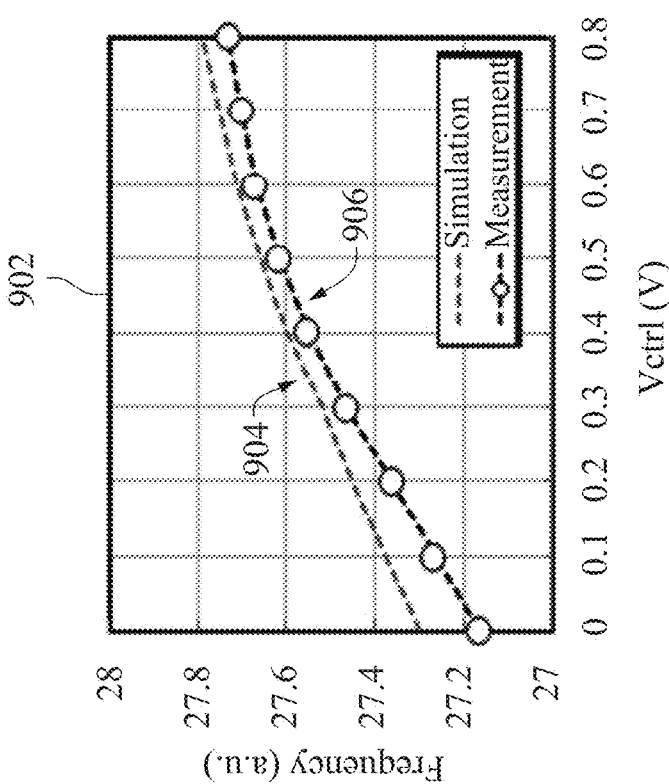

FIGS. 9A-9B are graphs of the measured oscillation frequency and measure phase noise of a VCO, in accordance with some embodiments.

FIG. 10 is a flowchart of a method of generating an oscillation signal, in accordance with one or more embodiments.

Figure 11A:
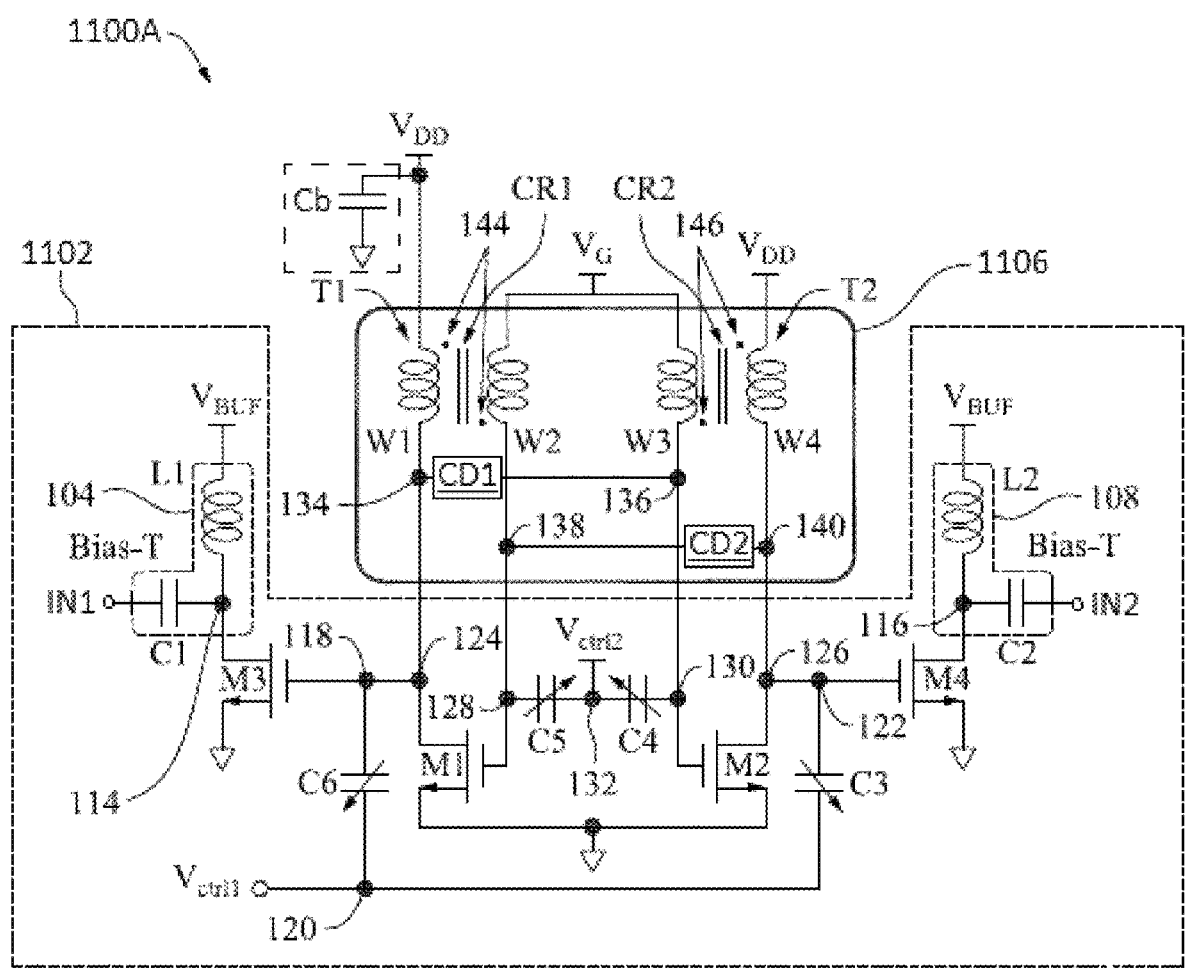
Figure 11B:
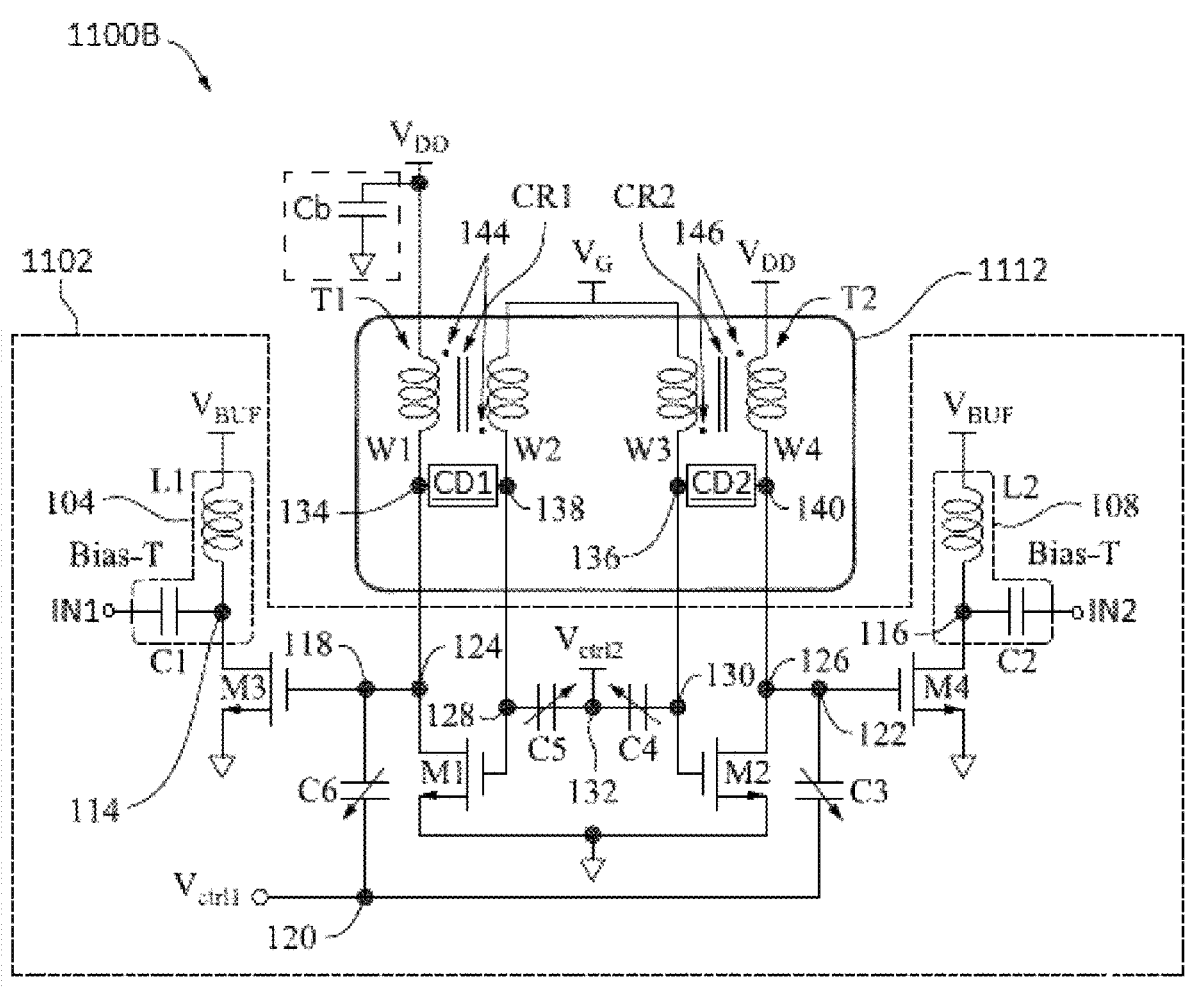

FIGS. 11A and 11B are schematic diagrams of VCOs, in accordance with some embodiments.

Figure 12A:
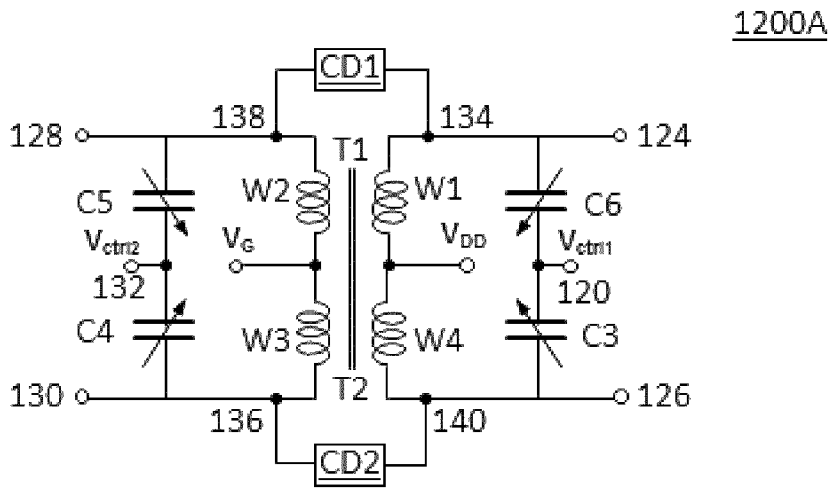
Figure 12B:
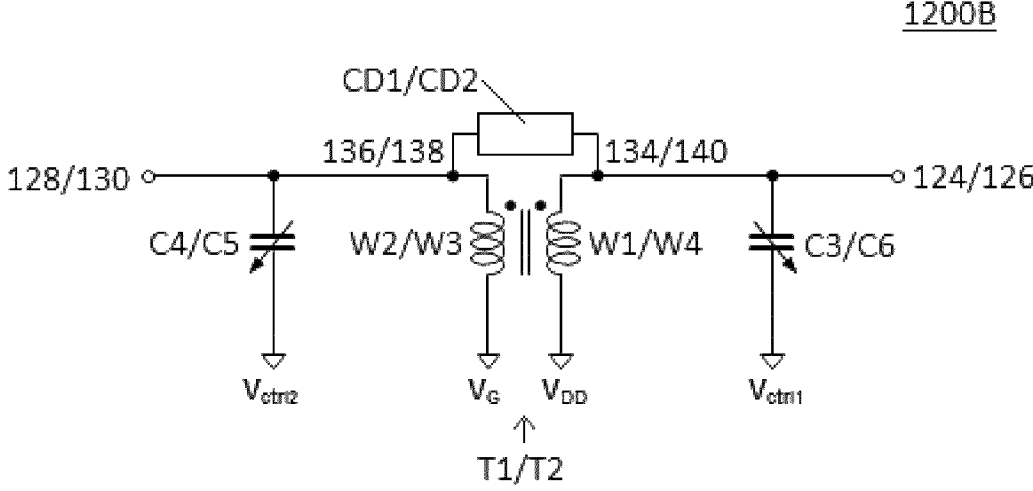

FIGS. 12A and 12B are schematic diagrams of a VCO circuit, in accordance with some embodiments.

FIGS. 13A-13E are schematic diagrams of feedback oscillators, in accordance with some embodiments.

Figure 14A:
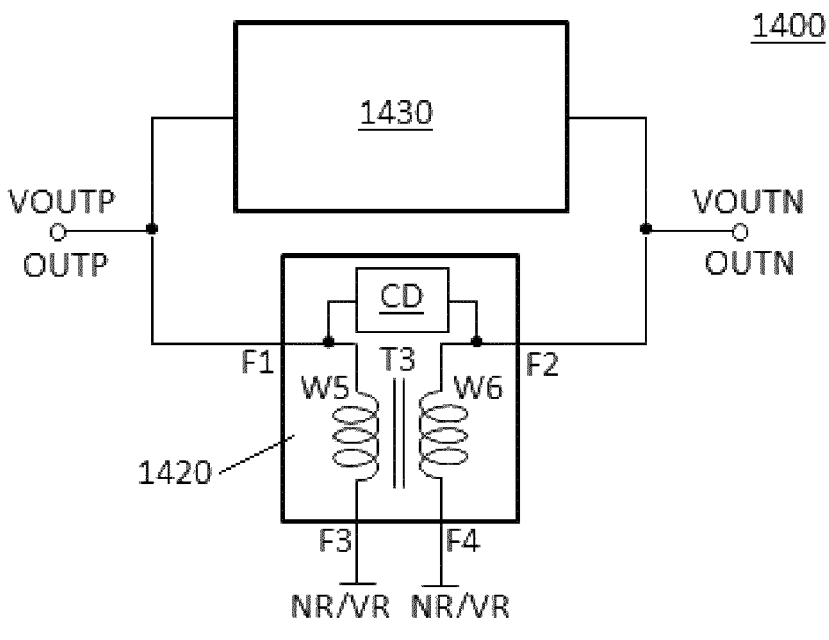
Figure 14B:
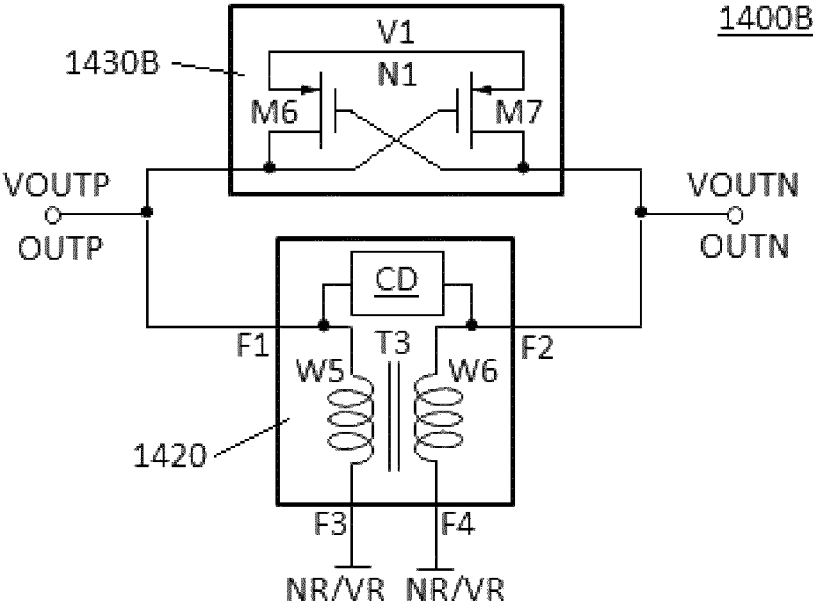

FIGS. 14A and 14B are schematic diagrams of differential oscillators, in accordance with some embodiments.

FIGS. 15A-21B are schematic diagrams of transformer-coupled BPFs, in accordance with some embodiments.

FIG. 22 is a flowchart of a method of generating an oscillation signal, in accordance with some embodiments.

DETAILED DESCRIPTION

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Voltage controlled oscillators (VCOs) are used as part of a phase locked loop (PLL) to synchronize the VCO frequency to a reference frequency. The quality of the output of a VCO is compromised when short term random frequency signal fluctuations, called phase noise, appear at the output. Phase noise introduces second order and third order harmonic spectral components that alter the output of a VCO. For a VCO to be operable with certain millimeter wave applications (mmWave) (30 GHz-300 GHz), the VCO needs to control the amount of phase noise that appears at the VCO output.

Figure 1A:
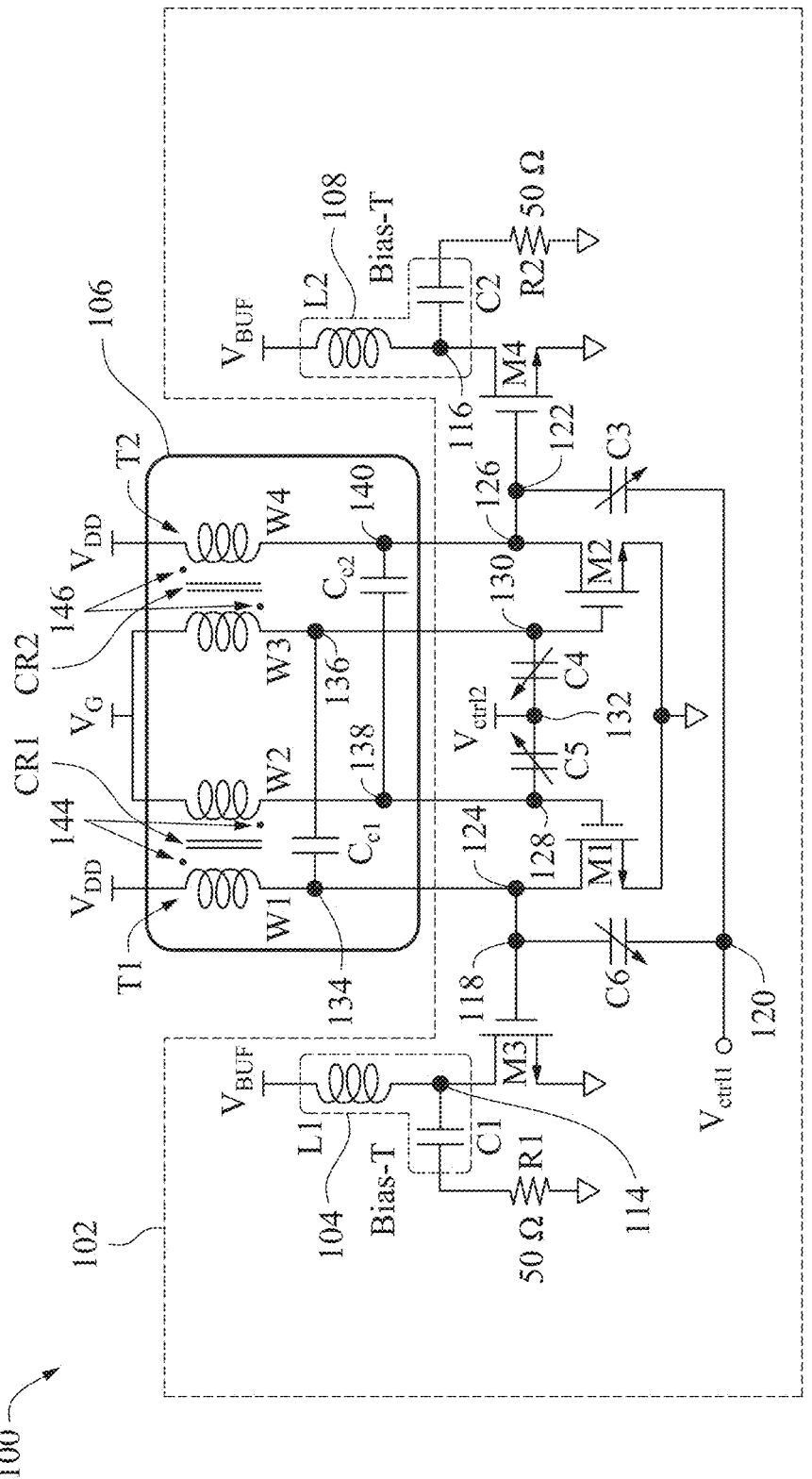
FIGS. 1A-1B are schematic diagrams of a voltage controlled oscillator (VCO), in accordance with some embodiments.

FIG. 1A is a schematic diagram of a VCO 100, in accordance with some embodiments. VCO 100 has two components: a resonator 102 and a transformer-coupled bandpass filter (BPF) 106. The resonator 102 is used for frequency detection and replication for the VCO 100. The resonator 102 includes two bias-tee (bias-T) circuits 104 and 108 that provide DC voltage or DC current in order to bias the resonator 102. The bias-T circuit 104 includes an inductor L1, a node 114, and a capacitive device C1. The inductor L1 is connected to the node 114 at one end and a DC voltage power source ($V_{BUF}$) at the other end. The capacitive device C1 is connected to the node 114 at one end and a resistor R1 at the other end. The resistor R1 is connected to a reference voltage node, also referred to as a ground source in some embodiments, at the other end. The bias-T circuit 108 includes an inductor L2, a node 116, and a capacitive device C2. The inductor L2 is connected to the node 116 at one end and a DC voltage power source ($V_{BUF}$) at the other end. The capacitive device C1 is connected to the node 116 at one end and a resistor R2 at the other end. The resistor R2 is connected to the ground source at the other end. The bias-T circuits 104 and 108 are used to provide a fixed DC voltage to transistors M3 and M4.

Transistor M3 is connected at a drain terminal to the node 114 and is connected at a source terminal to the ground source. A gate of transistor M3 is connected to a node 118. A variable capacitive device C6 is connected to the node 118 at one end and to an electrical node 120 at the other end. Transistor M4 is connected at a drain terminal to the node 116 and is connected at a source terminal to the ground source. The gate of transistor M4 is connected to a node 122. A variable capacitive device C3 is connected to the node 122 at one end and to the node 120 at the other end. The node 120 is connected to a first control voltage $V_{ctrl1}$.

A drain terminal of transistor M1 is connected to a node 124 and a source terminal is connected to the ground source. A drain terminal of transistor M2 is connected to a node 126, and a source terminal is connected to the ground source. A gate of transistor M1 is connected to a node 128, and a gate of transistor M2 is connected to a node 130. A variable capacitive device C5 is connected to the node 128 at one end and to a node 132 at the other end. A variable capacitive device C4 is connected to the node 130 at one end and to the node 132 at the other end. The node 132 is connected to a second control voltage source ($V_{ctrl2}$). The transistors M1 and M2 are thereby configured as a grounded pair of transistors.

The transformer-coupled BPF 106 includes a pair of coupled-transformers T1 and T2, and a pair of coupled capacitive devices $C_{c1}$ and $C_{c2}$. Transformer T1 includes a primary winding W1, a secondary winding W2, and a core CR1. The transformer T2 includes a primary winding W4 a secondary winding W3 and a core CR2. The transformer T1 and T2 are configured to operate together as a 1:2 transformer in this embodiment, however, in other embodiments the transformers T1 and T2 have different transformer implementations depending on power considerations of the VCO. The transformer T1 produces a phase difference of 180 degrees as indicated by the polarity dots 144 for transformer T1 while the phase produced by the transformer device T2 is −180 degrees as indicated by the polarity dots 146. The primary winding W1 is connected to node 134 at one end and to a power supply source (VDD) at the other end and the primary winding W4 is connected to node 136 at one end and to the power supply source (VDD) at the other end. The capacitive device $C_{c1}$ is connected between nodes 134 and 136. The secondary winding W2 is coupled to node 138 at one end and to a voltage source ($V_G$), also referred to as input voltage $V_G$ in some embodiments, at the other end and the secondary winding W3 is connected to node 140 at one end and to voltage source ($V_G$) at the other end. The capacitive device $C_{c2}$ is connected between nodes 138 and 140. The coupling of the pair of coupled capacitive devices $C_{c1}$ and $C_{c2}$ with the transformer T1 and T2 form a BPF.

The connection of node 134 to node 124, node 136 to node 130, node 138 to node 128, and node 140 to node 126 connects resonator component 102 to the transformer-coupled BPF 106.

Figure 1B:
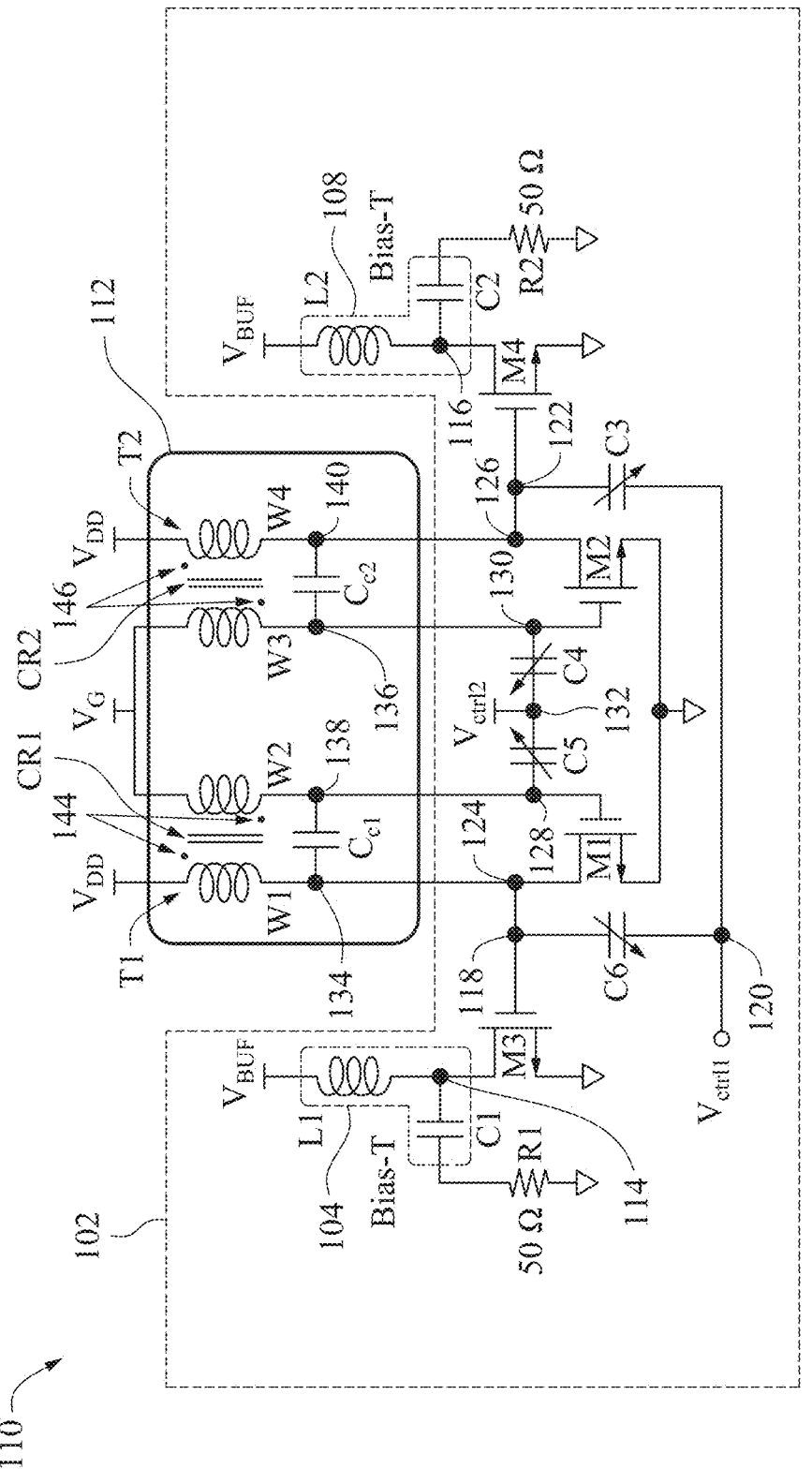

FIG. 1B is a schematic diagram of a VCO 110, in accordance with an embodiment. VCO 110 comprises the resonator component 102. VCO 110 differs from VCO 100 in the configuration of a transformer-coupled BPF 112 in connection with VCO 110. The transformer-coupled BPF 112 is similar to the transformer-coupled BPF 106 except for the connection of the pair of coupled capacitive devices $C_{c1}$ and $C_{c2}$. In VCO 110, the capacitive device $C_{c1}$ is connected between node 134 and node 138, and the capacitive device $C_{c2}$ is connected between node 136 and node 140. Both ends of the capacitive devices $C_{c1}$ and $C_{c2}$ of VCO 110 are connected to the terminals of the same transformers T1 and T2, which is opposite the connection of the capacitive devices $C_{c1}$ and $C_{c2}$ for VCO 100.

The pair of transistors M1 and M2 are configured to produce negative resistance to compensate for signal loss from the transformer-coupled BPF 106. The transistors M1 and M2 operate in the saturation region for current stability to reduce 1/f (also known as flicker noise) caused by charge trapping and releasing in the transistors M1 and M2; however, removing flicker noise does not reduce phase noise. Flicker noise is not a predominant factor at higher frequency ranges, such as 1 GHz or higher, where phase noise is more predominant. To reduce phase noise, the transformer-coupled BPFs 106 and 112 use the pair of coupled capacitive devices $C_{c1}$ and $C_{c2}$ to filter and reduce phase noise contributed by higher harmonics, such as $2f_0$, $3f_0$, or higher, where $f_0$ is a lower cutoff frequency of the transformer-coupled BPF 106 or 112 described herein. The capacitive devices $C_{c1}$ and $C_{c2}$ are each coupled to the pair of coupled-transformers T1 and T2 to form the transformer-coupled BPF 106 or 112. The frequency response of the transformer-coupled BPF 106 or 112 includes an additional transmission zero, defined as the frequency where the frequency response produces a nearly zero value. Capacitive devices, such as $C_{c1}$ and $C_{c2}$, increases the number of transmission zeros in a frequency response of a system due to filtering. The transmission zero for transformer-coupled BPFs 106 or 112 occurs at twice the lower cutoff frequency ($2f_0$), where the lower cutoff frequency ($f_0$) is the lowest corner frequency of the transformer-coupled BPF 106 or 112. Moreover, the pair of coupled capacitive devices $C_{c1}$ and $C_{c2}$ are configured so that the transformer-coupled BPF includes a bandpass range outside the frequency range of the phase noise contributed by the $2^{nd}$ and $3^{rd}$ harmonics. In at least some embodiments, the transformer-coupled BPF 106 or 112 reduces phase noise by 14 dB or more.

In some embodiments, the transistors M1-M4 are bipolar transistors, field effect transistors (FETs), or the like. In some embodiments, the transistors M1-M4 are metal-oxide semiconductor field-effect transistors (MOSFETs), such as CMOS, NMOS, PMOS, or the like. In some embodiments, the transistors M1-M4 are different types of transistors. In some embodiments, the ground source described is external to the VCO or internal ground to the VCO. In some embodiments, the variable capacitive devices C3-C6 are varactor structures or the like that allow capacitance to change based on voltage or current.

Figure 2B:
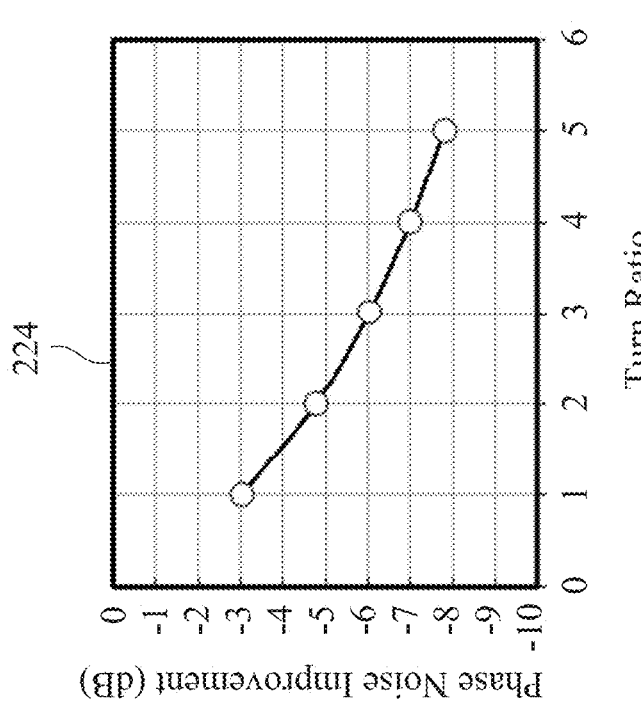
FIGS. 2A-2B are a schematic diagram and graph of the phase noise performance of a VCO, in accordance with some embodiments.
Figure 2A:
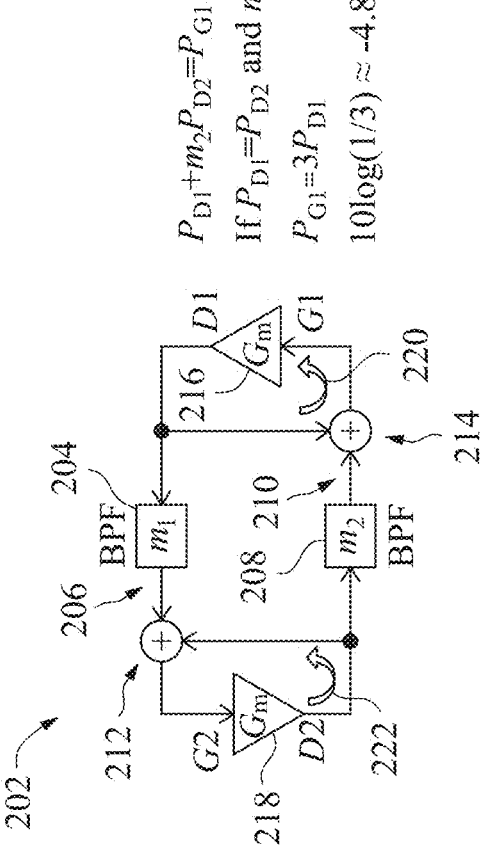

FIG. 2A is a schematic diagram of a feedback circuit of a VCO 202, in accordance with an embodiment. The VCO 202 includes a first BPF 204 having a gain $m_1$ that receives as input a signal D1. The first BPF 204 produces an output 206 that is a result of the multiplication of the gain $m_1$ and D1. A second BPF 208, having a gain $m_2$, receives as input a signal D2. The second BPF 208 produces an output signal 210 that is a result of the multiplication of a gain $m_2$ and D2. An adder 212 receives as input the signal 206 and the signal D2 and outputs a signal G2. An adder 214 receives as input the signal 210 and the signal D1 and outputs a signal G1. A conductance device 216 receives as input the signal G1, and outputs the signal D1. A conductance device 218 receives as input the signal G2, and outputs the signal D2. A feedback arm 220 is configured to include the conductance device 216 and adder 214 so the signal D1 produces consistent results. A feedback arm 222 is configured to include the conductance device 218 and adder 212 so the signal D2 produces consistent results.

In some embodiments, the gains $m_1$ and $m_2$ are related to the turn ratios of each of the transformers of the pair of coupled-transformers as described herein (e.g. "T1" and "T2"). In some embodiments, the gains $m_1$ and $m_2$ are the same or different. In some embodiments, the conductance devices 216 and 218 are the conductance of each of the transformers of the pair of coupled-transformers T1 and T2 of FIGS. 1A and 1B. In some embodiments, the conductance devices 216 and 218 include circuits that are external to the VCO 202.

The BPFs 204 and 208 increase the oscillation amplitude by applying gains $m_1$ and $m_2$ to signals D1 and D2 without requiring additional DC voltage. In this case, the signals D1 and D2 are substantially similar and the gains $m_1$ and $m_2$ are 2, and the transformers used by the BPFs 204 and 206 have turn ratios of 2. Moreover, all parasitic losses are negligible. Using these parameters, the signal power of G1 ($P_{G1}$) is approximately three times the signal power of D1 ($P_{D1}$) based on the feedback circuit of the VCO 202 and the following equation:

$$P_{D1} + m_2 P_{D2} = P_{G1}$$

$$\text{If } P_{D1} = P_{D2} \text{ and } m_1 = m_2 = 2$$

$$P_{G1} = 3P_{D1}.$$

The noise power does not increase due to the phase noise suppression of the PFs 204 and 208. The VCO 202 produces a phase reduction of approximately $10 \log(\frac{1}{3}) \approx -4.8$ dB.

In some embodiments, the turn ratio is higher than 2 and signals D1 and D2 are not similar.

FIG. 2B is a graph of the phase noise performance 224 of the VCO 202, in accordance with some embodiments. Plot 224 is a graph of the phase noise improvement in decibels (dB) versus turn ratio. As the turn ratio increases, phase noise improvement increases, i.e., dB levels fall, as depicted in plot 224.

Figure 3:
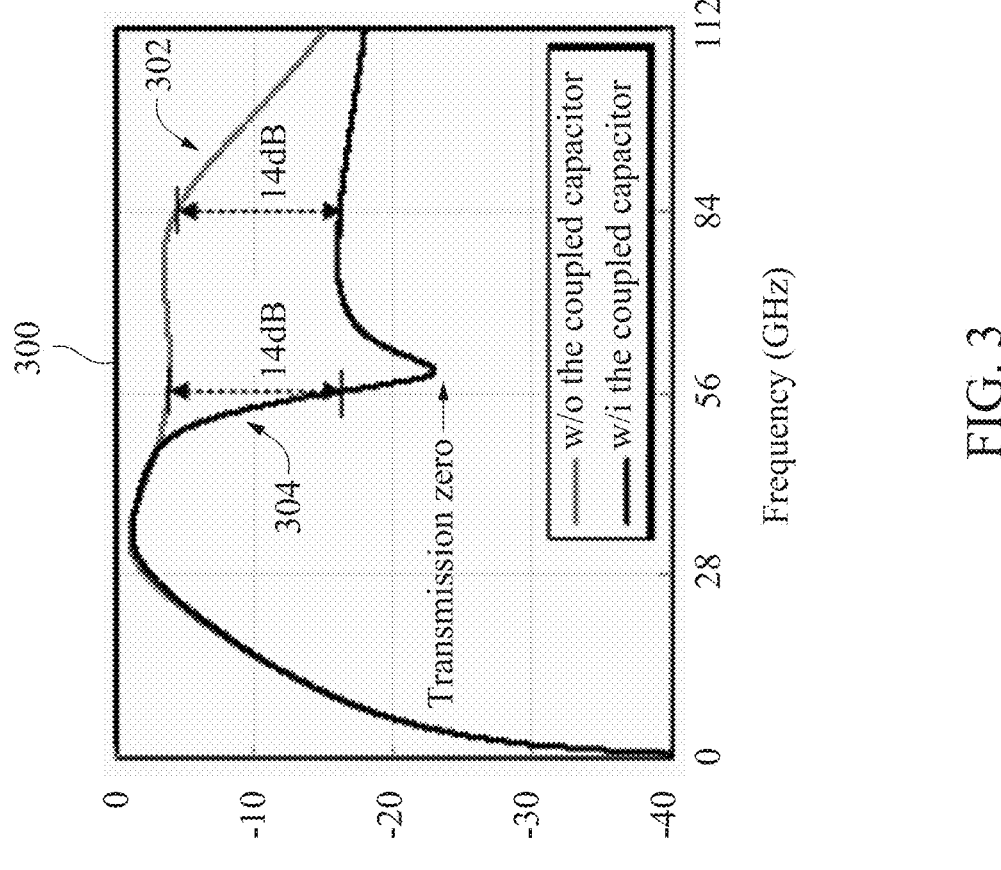
FIG. 3 is a graph of the transmission coefficient of a VCO, in accordance with some embodiments.

FIG. 3 is a graph 300 of the transmission coefficient of a VCO, in accordance with some embodiments. The transmission coefficient of the VCO indicates the amplitude and power outputted by the VCO. The plot 300 includes a curve 302 and a curve 304. The curve 302 includes the transmission coefficient versus frequency of a pair of coupled-transformers according to an approach not having a transformer-coupled BPF as described herein, and the curve 304 includes the transmission coefficient versus frequency of a transformer-coupled BPF (e.g. "106" or "112") of FIG. 1A or 1B. In this case, the transformer-coupled BPF has a lower cutoff frequency ($f_0$) of approximately 28 GHz. The curve 304 includes a transmission zero at approximately 56 GHz or ($2f_0$) with more than a 14 dB drop relative to the curve 302 at the same point. At 84 GHz, the curve 304 includes a drop of approximately 14 dB relative to the curve 302. The pair of coupled capacitors filters out the higher frequency components of the phase noise.

Figure 4:
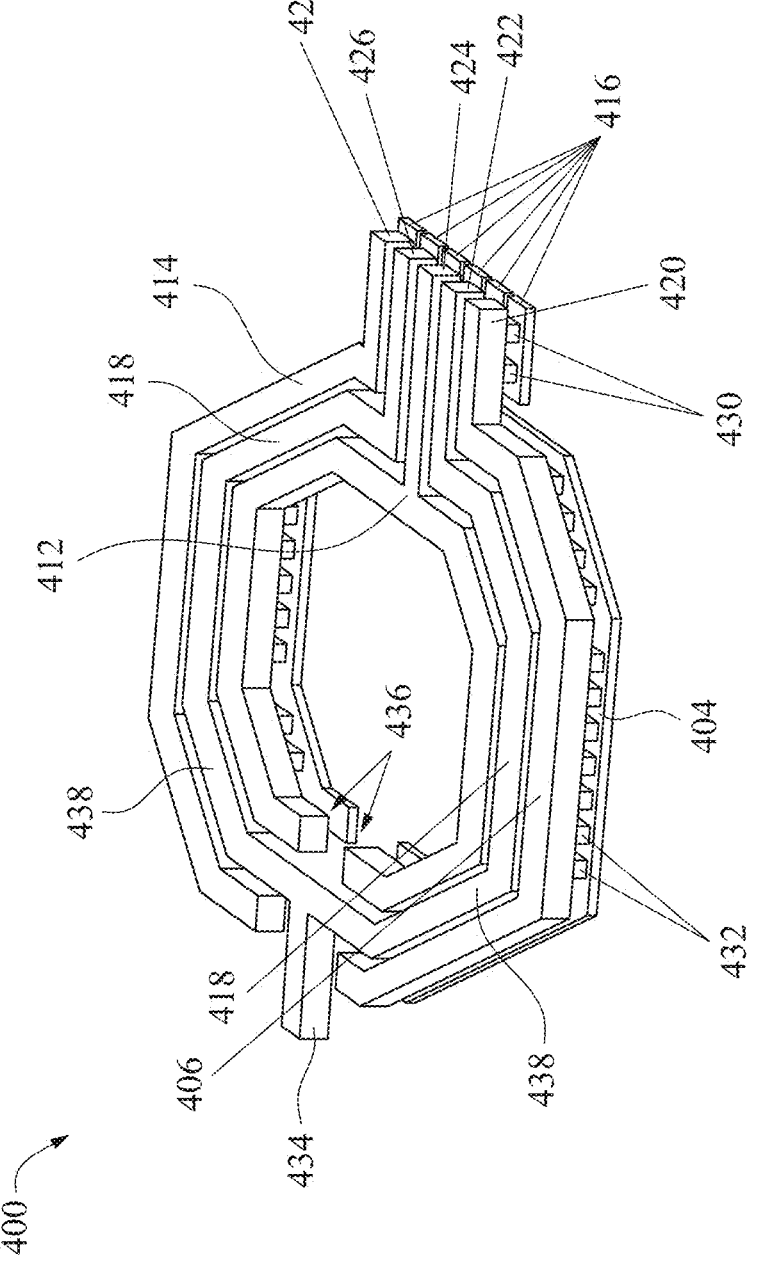
FIG. 4 is a schematic diagram of a transformer of a transformer-coupled bandpass filter (BPF), in accordance with some embodiments.

FIG. 4 is a schematic diagram of a pair of coupled-transformers 400 used in a transformer-coupled BPF, in accordance with some embodiments. The pair of coupled-transformers 400 is configured in a two stacked metal layer arrangement. The pair of coupled-transformers includes a number of conductive structures 406, 412, and 414 formed on a metal layer. Also, the pair of coupled-transformers 400 include a conductive structure 418 formed on the metal layer having a first terminal 434 at one end of the coupled-transformer 400 where two extending portions 438 extend from the first terminal 434 to two terminals 422 and 426 at the opposite end. The extending portions 438 are configured to be the primary windings W1 and W4 shown in FIGS. 1A-1B.

The conductive structure 412 includes a terminal 424 at one end and two oppositely extending portions 436 at the opposite end of the conductive structure 412. The two oppositely extending portions 436 extend from the terminal 424. The conductive structure 406 includes a first end that is connected to one of the extending portions 436 near the first terminal 434. The conductive structure 406 includes a terminal 420 positioned at an opposite end from the first end. The conductive structure 414 includes a first end that is connected to another of the extending portions 436 of the conductive structure 412 near the first terminal 434. Also, the conductive structure 414 includes a terminal 428 positioned at an opposite end from the first end. Conductive structures 406 and 414 connect with the extending portions 436 of the conductive structure 412 below the first terminal 434.

Via structures 430 and 432 are configured to provide the connections necessary to form the pair of coupled-transformers 400. A portion of the conductive structures 406, 412, 414, and 418 are positioned above a first substrate 404. The via structures 432 are configured to make connections between the conductive structures 406 and 412 to form the secondary winding W2 of FIGS. 1A-1B and between conductive structures 412 and 414 to form the secondary winding W3 of FIGS. 1A-1B. The connection between the conductive structure 406 and the conductive structure 412 and between the conductive structure 414 and the conductive structure 412 is beneath the first terminal. The other portions of the conductive structures 406, 412, 414 and 418 include the terminals 420, 422, 424, 426, and 428 are each positioned above one of a series of second substrate structures 416. The second substrate structures 416 are individually patterned to have similar dimensions with terminals 420, 422, 424, 426, and 428. Moreover, the via structures 430 are configured to make connections between the terminals 420 and 424 and between the terminals 424 and 428.

In some embodiments, the first substrate 404 and second substrate 416 are separate substrates. In some embodiments, the first substrate 404 and second substrates 416 form a single substrate structure. In some embodiments, the first substrate 404 is a silicon (Si) substrate or a metal substrate. In some embodiments, the second substrate 416 is a Si substrate or a metal substrate.

In some embodiments, the via structures 430 and 432 are square vias. In some embodiments, the via structures 430 and 432 have octagonal shapes, hexagonal shapes, rectangular shapes, or the like. In some embodiments, the via structures 430 and 432 are through silicon vias. In some embodiments, the via structures 430 and 432 are holes etched in an interlayer dielectric that is filled with a metal. In some embodiments, the via structures 430 and 432 are buried vias. In some embodiments, the via structure 430 is different from via structure 432. In some embodiments, the via structures 430 and/or 432 are replaced with layered metal pairs to form interconnections with the conductive structures 406, 412, 414, and 418.

Figure 5B:
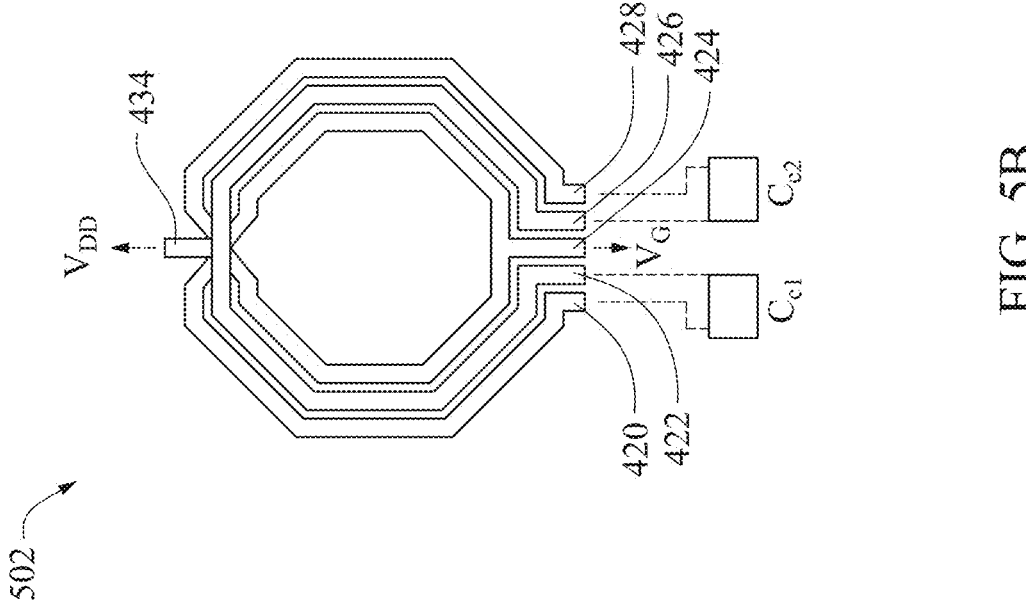
FIGS. 5A-5B are schematic diagrams of a transformer-coupled BPF, in accordance with some embodiments.
Figure 5A:
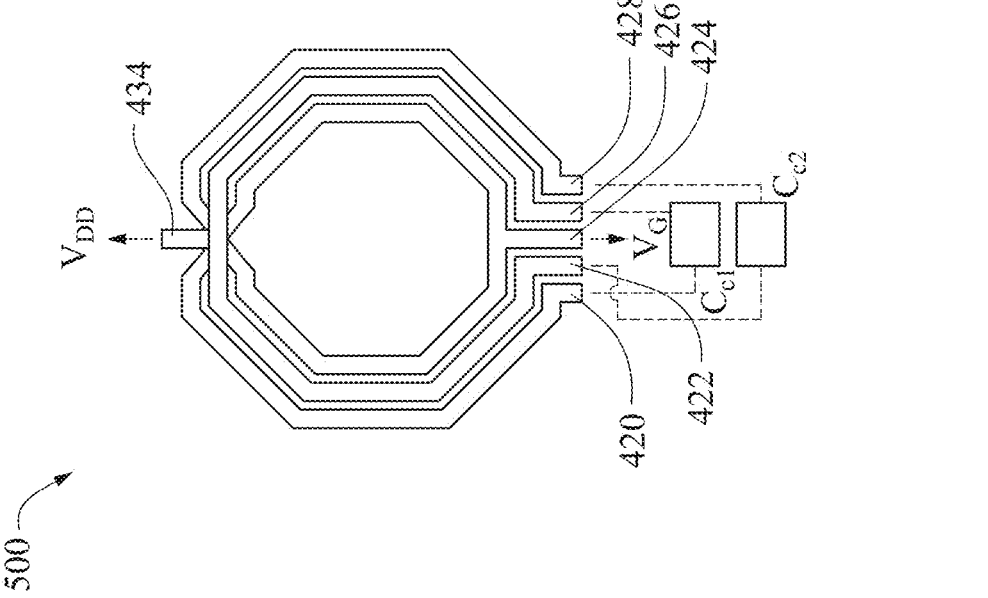

FIG. 5A is a schematic diagram of a transformer-coupled BPF 500, in accordance with some embodiments. The transformer-coupled BPF 500 includes a pair of coupled-transformers that is similar to the pair of coupled-transformers 400 of FIG. 4. Moreover, FIG. 5A includes the same coupling arrangement of the pair of coupled capacitive devices $C_{c1}$ and $C_{c2}$ as in FIG. 1A of the transformer-coupled BPF 106. The first terminal 434 is coupled to the voltage source $V_{DD}$ and the input voltage ($V_G$) is connected to terminal 424. The coupled capacitive device $C_{c1}$ is connected at one end to terminal 420 and the other end is connected to terminal 426. The coupled capacitive device $C_{c2}$ is connected at one end to terminal 422 and the other end is connected to terminal 428. The transformer-coupled BPF 500 is an embodiment of the transformer-coupled BPF 106 of FIG. 1A.

FIG. 5B is a schematic diagram of a transformer-coupled BPF 502, in accordance with some embodiments. The transformer-coupled BPF 502 includes a pair of coupled-transformers that is similar to the pair of coupled-transformers 400 of FIG. 4. Moreover, FIG. 5B includes a similar coupling arrangement as in FIG. 1B of the pair of coupled capacitive devices $C_{c1}$ and $C_{c2}$ of the transformer-coupled BPF 112. The first terminal 434 is coupled to the voltage source $V_{DD}$ and the input voltage ($V_G$) is connected to terminal 424. The coupled capacitive device $C_{c1}$ is connected at one end to terminal 420 and the other end is connected to terminal 422. The coupled capacitive device $C_{c2}$ is connected at one end to terminal 426 and the other end is connected to terminal 428. The transformer-coupled BPF 502 is an embodiment of the transformer-coupled BPF 112 of FIG. 1B.

The transformer-coupled BPFs 500 and 502 have similar properties described herein for the transformer-coupled BPFs 106 and 112 of FIG. 1A and FIG. 1B. In particular, the transformer-coupled BPFs 500 and 502 have a transmission zero at twice the lower cutoff frequencies ($2f_0$). Moreover, the transformer-coupled BPFs 500 and 502 filter phase noise contributed by the $2^{nd}$ and $3^{rd}$ harmonics, as described herein.

Figure 6B:
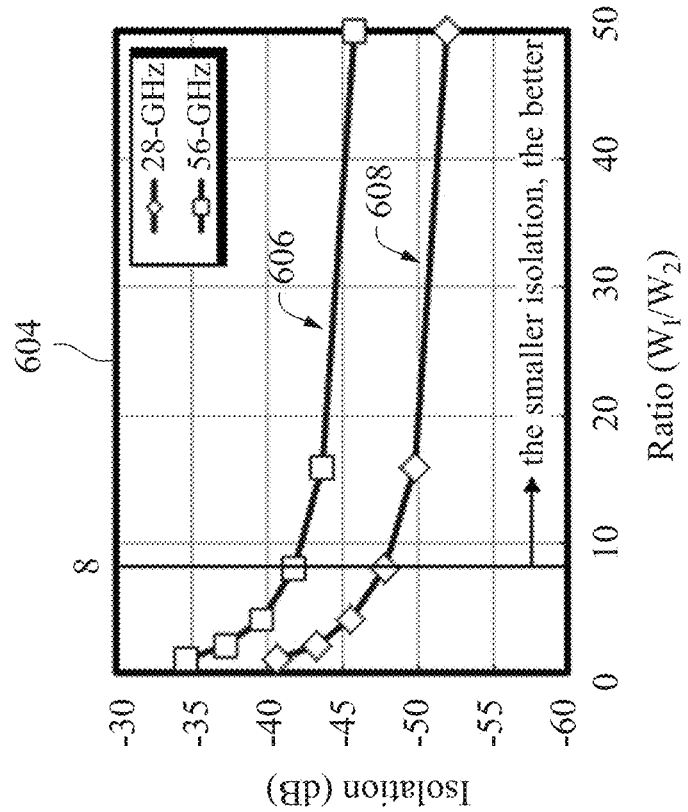
FIGS. 6A-6B are a schematic diagram of a transformer-coupled BPF and a graph of the isolation of the transformer-coupled BPF, respectively, in accordance with some embodiments.
Figure 6A:
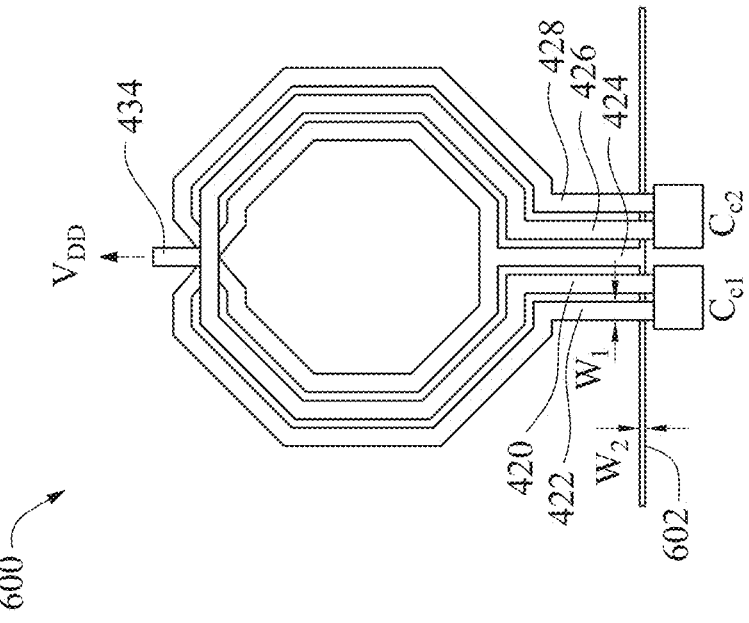

FIG. 6A is a schematic diagram of a transformer-coupled BPF 600, in accordance with some embodiments. The transformer-coupled BPF 600 is similar to the transformer-coupled BPF 502 described in FIG. 5B. FIG. 6A includes the terminal 424 being coupled to the lowest metal layer 602, and the pair of capacitive devices $C_{c1}$ and $C_{c2}$ being similarly arranged as the transformer-coupled BPF 502 of FIG. 5B. The metal layer 602 is configured to be coupled to the voltage source ($V_G$). Also, the transformer-coupled BPF 600 is configured to provide isolation to prevent noise produced by parasitic resistance or the like. The width ratio between the width of the terminals ($W_1$) and the width of the metal layer 602 ($W_2$) is correlated to increasing isolation in the transformer-coupled BPF 600.

FIG. 6B is a graph of the isolation versus width ratio ($W_1/W_2$). The plot 604 includes two curves 606 and 608. The curve 606 includes the isolation versus width ratio for a transformer-coupled BPF operating at 28 GHz, and the curve 608 includes the isolation versus width ratio for a transformer-coupled BPF operating at 56 GHz. The higher the width ratio the better the isolation, as shown in both curves 606 and 608. One way to increase isolation is to decrease the width ($W_2$) of the metal layer 602. At 28 GHz and 56 GHz, a width ratio of 8 or higher is used.

Figure 7:
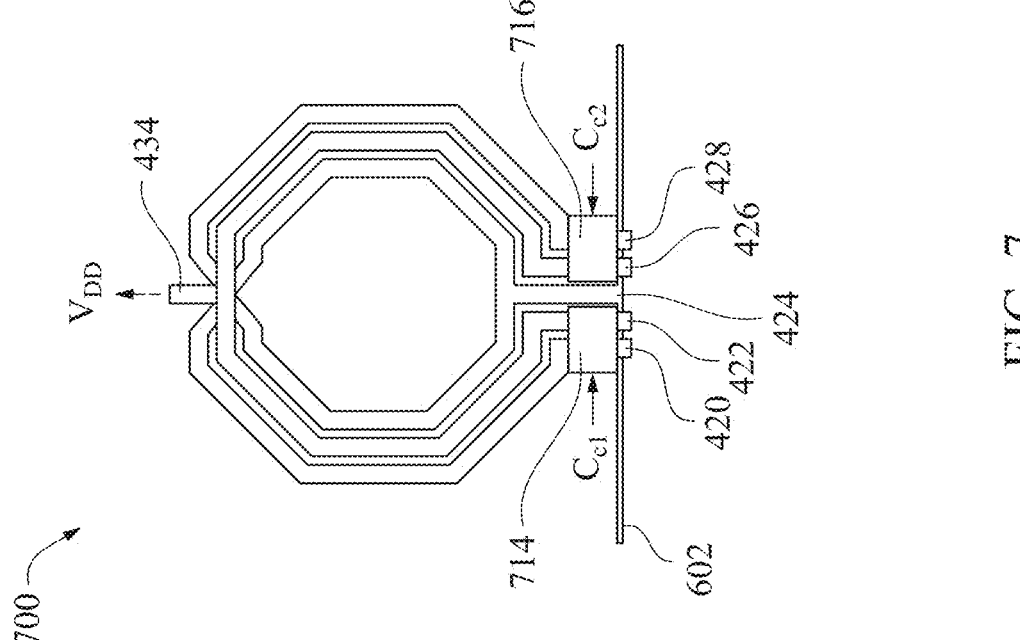
FIG. 7 is a schematic diagram of a transformer-coupled BPF, in accordance with some embodiments.

FIG. 7 is a schematic diagram of a transformer-coupled bandpass filter (BPF) 700, in accordance with some embodiments. The transformer-coupled BPF 700 is similar to the transformer-coupled BPF 600 described in FIG. 6A. Also, FIG. 7 includes a pair of coupled capacitive devices $C_{c1}$ and $C_{c2}$ being positioned at a lower metal layer beneath the transformer-coupled BPF 700 at regions 714 and 716. The placement of the coupled pair of capacitive devices $C_{c1}$ and $C_{c2}$ at the lower metal layer beneath the transformer allows for sufficient separation between the coupled pair of capacitive devices $C_{c1}$ and $C_{c2}$ and the other operational elements of the transformer-coupled BPF 700. The separation lowers the effects of parasitic capacitance introduced by the coupled capacitive devices $C_{c1}$ and $C_{c2}$ to the remaining operational elements of the transformer-coupled BPF 700. Moreover, the space area of the transformer-coupled BPF 700 is decreased. In some embodiments, a layer of insulator material or the like is used to form the pair of coupled capacitive devices underneath the transformer.

FIG. 8A is a graph 800 of the output power of a VCO, in accordance with some embodiments. In particular, the graph 800 includes the output power versus frequency at the fundamental frequency and several harmonics of a first VCO according to another approach not having a transformer-coupled BPF as described herein and a second VCO according to the approach of a transformer-coupled BPF as described herein. The fundamental frequency is 28 GHz. At the second harmonic (56 GHz), the first VCO produces a drop of 22 dB in phase noise and the second VCO produces a larger drop of 28 dB. At the third harmonic (84 GHz) and fourth harmonic (112 GHz), the second VCO produces larger drops in phase noise relative to the first VCO due to filtering properties of the transformer-BPFs as described herein.

FIG. 8B is a graph of the noise suppression of a VCO, in accordance with some embodiments. In this case, FIG. 8B includes a graph 802 having two curves 804 and 806. The curve 804 is the simulated phase noise versus offset frequency of a first VCO according to another approach not having a transformer-coupled BPF as described herein and curve 806 is the simulated phase noise versus offset frequency of a second VCO having a transformer-coupled BPF as described herein. The phase noise of the second VCO is improved by 6.8 and 4.6 dB at 100 kHz and 1 MHz offset as shown in FIG. 8B.

FIG. 9A is a graph 902 of the measured frequency oscillation. The graph 902 includes two curves 904 and 906. The curve 904 includes a simulation of the oscillation frequency versus control voltage (Vctrl2) of a VCO having a transformer-coupled BPF as described herein, and the curve 906 shows the actual measurement of the oscillation frequency versus control voltage (Vctrl2) of the same VCO. The tuning range illustrated in plot 902 is between 27.2 GHz and 27.7 GHz. The more the control voltage increases the smaller the difference between the oscillation frequencies of the simulation and measurement becomes, as shown in FIG. 9A.

FIG. 9B is a graph 904 of the measured phase noise. The graph 904 includes two curves 908 and 910. The curve 908 is the measured phase noise at 27.4 GHz for a first VCO according to another approach not having a transformer-coupled BPF as described herein while curve 910 is the measured phase noise at 27.4 GHz for a second VCO having a transformer-coupled BPF as described herein. The measured phase noise for curve 910 is improved by 5 dB compared to the measured phase noise for curve 908. This improvement is consistent with the 4.8 dB phase noise reduction discussed in FIGS. 2A-2B.

FIG. 10 is a flowchart of a method 1000 of generating an oscillation signal, in accordance with one or more embodiments. The method 1000 is usable to generate a low phase noise oscillation signal. In step 1002, an input voltage, such as $V_G$ (FIG. 2A), is received at an input terminal, such as terminal 424 of the pair of coupled-transformer 400, of a transformer-coupled BPF.

In step 1004, a power supply voltage, such as VDD, is received at a power supply input, such as first terminal 434 of the pair of coupled-transformer 400, of the transformer-coupled BPF.

In step 1006, the transformer-coupled BPF is coupled with a control voltage, such as Vctrl2 or Vctrl1, through a transistor pair, such as M1 and M2. In some embodiments, the transformer-coupled BPF includes a pair of coupled-transformers having specific turn ratios. The transformer-coupled BPF includes a pair of coupled capacitive devices. In some embodiments, a first capacitive device of the pair of coupled capacitive devices is coupled at one end to a gate of a first transistor of the pair of transistors and the other end is coupled to a drain of a second transistor of the pair of transistors, and a second capacitive device of the pair of coupled capacitive devices is coupled at one end to the drain of the first transistor of the pair of transistors and the other end is coupled to the gate of the second transistor of the pair of transistors. In some embodiments, the first capacitive device of the pair of coupled devices is coupled at one end to a gate and the other end is coupled to a drain of a first transistor of the pair of transistors, and the second capacitive device of the pair of coupled capacitive devices is coupled at one end to a gate and the other end is coupled to a drain of a second transistor of the pair of transistors.

In step 1008, the oscillating signal is produced having a frequency that corresponds to a voltage level of the control voltage.

FIGS. 11A and 11B are schematic diagrams of respective VCOs 1100A and 1100B, in accordance with some embodiments. VCO 1100A corresponds to VCO 100 discussed above with respect to FIG. 1A, and in some embodiments is equivalent to VCO 100, as discussed below. VCO 1100B corresponds to VCO 110 discussed above with respect to FIG. 1B, and in some embodiments is equivalent to VCO 110, as discussed below.

Each of VCOs 1100A and 1100B includes power supply source VDD and voltage source VG, each discussed above with respect to VCOs 100 and 110 and FIGS. 1A and 1B, a resonator 1102, and, in some embodiments, a capacitive device Cb coupled between power supply source VDD and the ground source. VCO 1100A also includes a transformer-coupled BPF 1106, and VCO 1100B also includes a trans-former-coupled BPF 1112.

Transformer-coupled BPF 1106 corresponds to trans-former-coupled BPF 106 discussed above with respect to VCO 100 and FIG. 1A, and in some embodiments is equivalent to transformer-coupled BPF 106, as discussed below. Transformer-coupled BPF 1112 corresponds to trans-former-coupled BPF 112 discussed above with respect to VCO 110 and FIG. 1B, and in some embodiments is equivalent to transformer-coupled BPF 112, as discussed below.

Each of transformer-coupled BPFs 1106 and 1112 includes the circuit elements and configurations of respec-tive transformer-coupled BPFs 106 and 112, except that each of transformer-coupled BPFs 1106 and 1112 includes cou-pling devices CD1 and CD2 instead of capacitive devices $C_{c1}$ and $C_{c2}$.

A coupling device, e.g., coupling device CD1 or CD2, is an IC device including one or more IC structures configured to provide an impedance, e.g., a capacitive and/or inductive path, between two terminals, e.g., terminals coupled to nodes 134, 136, 138, and 140 as depicted in FIGS. 11A and 11B. In various embodiments, a coupling device includes one or more of a capacitive device, e.g., a plate capacitor, e.g., a metal-insulator-metal (MIM) capacitor, a capacitor-configured MOS device, or an adjustable capacitor, e.g., a MOSCAP, a capacitor network, an LC network, or another IC structure capable of providing the path impedance. In various embodiments, a coupling device is one of coupling devices 1900C-2100C depicted in respective FIGS. 19A-21B and discussed below.

In some embodiments, a coupling device is equivalent to a capacitive device. In some embodiments, by including a capacitive device and one or more elements in addition to the capacitive device, a coupling device is capable of having frequency characteristics different from those of the capaci-tive device alone. In various embodiments, a coupling device is thereby capable of having multiple transmission zeroes such that, compared to a circuit including a capacitive device alone, the circuit including the coupling device exhibits improved suppression of harmonics in operation.

In some embodiments, a coupling device is one of capaci-tive devices $C_{c1}$ or $C_{c2}$. In some embodiments, one or both of transformer-coupled BPFs 1106 or 1112 includes capaci-tive devices $C_{c1}$ and $C_{c2}$ as respective coupling devices CD1 and CD2 and is thereby equivalent to the corresponding one or both of transformer-coupled BPFs 106 or 112.

Resonator 1102 includes DC voltage power source $V_{BUF}$, control voltages $V_{ctrl1}$ and $V_{ctrl2}$, bias-T circuits 104 and 108, transistors M1-M4, and capacitive devices C3-C6, configured as discussed above with respect to resonator 102 and FIGS. 1A and 1B. Compared to resonator 102 discussed above, resonator 1102 depicted in FIGS. 11A and 11B does not include resistors R1 and R2, and instead includes respec-tive input terminals IN1 and IN2. In some embodiments, resonator 1102 includes resistor R1 (not shown in FIGS. 11A and 11B) coupled between input terminal IN1 and the ground voltage and resistor R2 (not shown in FIGS. 11A and 11B) coupled between input terminal IN2 and the ground voltage, and is thereby equivalent to resonator 102.

In various embodiments, one or both of input terminals IN1 or IN2 is coupled to one or more circuit elements (not shown) external to resonator 1102 and is thereby configured to control a voltage level at the respective node 114 or 116 based on DC voltage power source $V_{BUF}$ and the respective one of bias-T circuit 104 or 108. Compared to VCOs 100 and 110 including resonator 102 discussed above, VCOs 1100A and 1100B including resonator 1102 are thereby configured to have increased biasing flexibility, in operation.

Capacitive device Cb is a capacitor, MOSFET, or similar IC device coupled between power supply source VDD and the ground voltage. Capacitive device Cb thereby provides a low-resistance path between power supply source VDD and the ground voltage for alternating current (AC) signals in operation, and each of VCOs 1100A and 1100B is thereby configured to reduce effects from radio frequency (RF) and/or low frequency noise, e.g., possible oscillations in biasing networks. Compared to VCOs 100 and 110, VCOs 1100A and 1100B including capacitive device Cb are thereby configured to have increased stability.

By the configurations discussed above, each of VCOs 1100A and 1100B is capable of realizing the benefits discussed above with respect to VCOs 100 and 110 along with increased harmonic suppression, flexibility, and/or stability as discussed above.

In some embodiments, VCO 1100A includes transformer-coupled BPF 1106 equivalent to transformer-coupled BPF 106, resonator 1102 equivalent to resonator 102, and does not include capacitive device Cb, e.g., capacitive device Cb is external to VCO 1100A, and VCO 1100A is thereby equivalent to VCO 100 discussed above with respect to FIG. 1A. In some embodiments, VCO 1100B includes transformer-coupled BPF 1112 equivalent to transformer-coupled BPF 112, resonator 1102 equivalent to resonator 102, and does not include capacitive device Cb, e.g., capacitive device Cb is external to VCO 1100B, and VCO 1100B is thereby equivalent to VCO 110 discussed above with respect to FIG. 1B.

Table 1 lists parameters for various known approaches in which a VCO does not include a transformer-coupled BPF in comparison with a non-limiting example of VCO 1100A. The first column includes either a reference number or the non-limiting example of VCO 1100A, the second column indicates either a CMOS or SOI technology corresponding to each approach. The third through eighth columns indicate a respective power supply voltage level, carrier frequency, phase noise level at 1 megahertz (MHz), power consumption level, phase noise as a figure of merit (FoM), and core area corresponding to each approach.

between nodes 138 and 140, and VCO circuit 1200A thereby corresponds to a portion of VCO 1100A.

FIG. 12A depicts a DC biasing of VCO circuit 1200A, in operation, in which voltage source $V_G$ is applied between windings W2 and W3, power supply source VDD is applied between windings W1 and W4, control voltage $V_{ctrl1}$ is applied at node 120, and control voltage $V_{ctrl2}$ is applied at node 132. For AC signals (not shown) generated in response to the applied voltages, the applied voltages can be collectively considered as a virtual ground, also referred to as an AC ground in some embodiments.

By the configuration discussed above, in operation, the AC signals relative to virtual ground have a positive 180° phase shift at node 128 and a negative 180° phase shift at node 126 relative to a phase of zero at each of nodes 124 and 130. Because node 128 is coupled to the gate of transistor M1 depicted in FIGS. 1A, 1B, 11A, and 11B, node 126 is coupled to the drain terminal of transistor M2 depicted in FIGS. 1A, 1B, 11A, node 124 is coupled to the drain terminal of transistor M1, and node 130 is coupled to the gate of transistor M2, in operation, each of transistors M1 and M2 experiences a 180° phase shift such that each of VCOs 100, 110, 1100A, and 1100B, including transistors M1 and M2 configured as discussed above, oscillates in response to the applied voltages.

FIG. 12B depicts VCO circuit 1200B equivalent to portions of VCO circuit 1200A corresponding to each of transistors T1 and T2, and thereby illustrates an equivalent AC circuit for each relevant portion. As depicted in FIG.

TABLE 1

| Ref. | Technology | $V_{DD}$ (V) | Frequency (GHz) | Phase Noise @ 1-MHz (dBc/Hz) | Power consumption (mW) | FoM (dBc/Hz) | Core area (mm²) |
|---|---|---|---|---|---|---|---|
| 1 | CMOS | 1.2 | 28 | −112.9 | 12 | −191 | 0.086 |
| 2 | CMOS | 1.2 | 20.9 | −103.2 | 7.2 | −181 | 0.088** |
| 3 | CMOS | 1.0 | 26.4 | −106.6 | 12.7 | −184 | 0.047 |
| 4 | CMOS | 0.9 | 24.8 | −101 | 13.5 | −178 | 0.018*** |
| 5 | SOI | 0.9 | 24.7 | −107.3* | 24 | −181 | 0.075*** |
| 6 | CMOS | 0.9 | 25.6 | −102.5 | 5.5 | −183 | 0.067 |
| 7 | CMOS | 1.0 | 27.3 | −105.7 | 11.6 | −184 | 0.064 |
| VCO1100A | CMOS | 0.8 | 27.5 | −108.1 | 4 | −191 | 0.011 |

As illustrated in Table 1, the non-limiting example of VCO 1100A provides a relatively low-power, small-area approach having at least equivalent performance parameters compared to the other approaches considered.

FIGS. 12A and 12B are schematic diagrams of respective VCO circuits 1200A and 1200B, in accordance with some embodiments. VCO circuit 1200A, equivalent to a portion of VCO 1100A or VCO 1100B, and VCO circuit 1200B, an alternative representation of VCO circuit 1200A, depict equivalent circuits that illustrate operation of VCOs 1100A and 1100B, as discussed below.

VCO circuit 1200A includes transformer T1 including windings W1 and W2, transformer T2 including windings W3 and W4, capacitive devices C3-C6, and nodes 120 and 124-140, each discussed above with respect to FIGS. 1A, 1B, 11A, and 11B, and coupling devices CD1 and CD2, discussed above with respect to FIGS. 11A and 11B. In the embodiment depicted in FIG. 12A, coupling device CD1 is coupled between nodes 134 and 138, coupling device CD2 is coupled between nodes 136 and 140, and VCO circuit 1200A thereby corresponds to a portion of VCO 1100B. In some embodiments, coupling device CD1 is coupled between nodes 134 and 136, coupling device CD2 is coupled 12B, each of voltage source $V_G$, power supply source VDD, and control voltages $V_{ctrl1}$ and $V_{ctrl2}$ is represented as both the applied voltage and as virtual ground of the equivalent AC circuit.

In the case of transformer T1, capacitive device C5 is coupled between node 128 and virtual ground, winding W2 is coupled between node 138 and virtual ground, winding W1 is coupled between node 134 and virtual ground, capacitive device C6 is coupled between node 124 and virtual ground, and coupling device CD1 is coupled between nodes 134 and 138. In operation, the gate of transistor M1 coupled to node 128 and the drain terminal of transistor M1 coupled to node 124 are thereby controlled based on the configuration of transformer T1.

In the case of transformer T2, capacitive device C4 is coupled between node 130 and virtual ground, winding W3 is coupled between node 136 and virtual ground, winding W4 is coupled between node 140 and virtual ground, capacitive device C3 is coupled between node 126 and virtual ground, and coupling device CD2 is coupled between nodes 136 and 140. In operation, the gate of transistor M2 coupled to node 130 and the drain terminal of transistor M2 coupled to node 126 are thereby controlled based on the configuration of transformer T2.

Figure 13A:
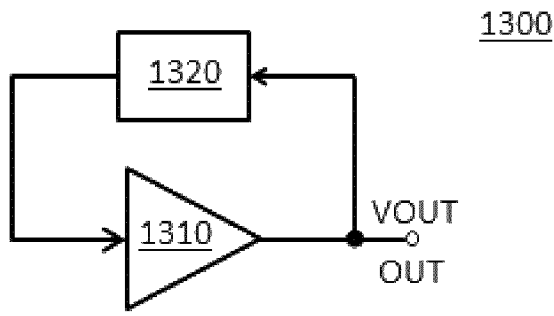

FIGS. 13A-13E are schematic diagrams of feedback oscillators, in accordance with some embodiments FIG. 13A is a block diagram of a feedback oscillator 1300, referred to as a single-end feedback oscillator 1300 in some embodiments. FIGS. 13B-13E are diagrams of respective feedback oscillators 1300B-1300E that are non-limiting examples of feedback oscillator 1300 in accordance with various embodiments.

As depicted in FIG. 13A, feedback oscillator 1300 includes a forward stage 1310 and a feedback network 1320, each coupled to an output node OUT. Forward stage 1310 and feedback network 1320 are arranged in a cross-coupled configuration, feedback network 1320 thereby being configured to provide positive feedback to forward stage 1310.

Two or more circuit elements are considered to be coupled based on a direct electrical connection or an electrical connection that includes one or more additional circuit elements, e.g., one or more logic or transmission gates, and is thereby capable of being controlled, e.g., made resistive or open by a transistor or other switching device.

In various embodiments, feedback oscillator 1300 includes one or more nodes (not shown in FIG. 13A) configured to have one or more corresponding voltages, e.g., a node N1 configured to have a voltage V1, a node N2 configured to have a voltage V2, and a reference node NR configured to have a reference voltage VR, as variously depicted in FIGS. 13B-13E.

In the embodiments depicted in FIGS. 13A-13E, reference voltage VR is a ground voltage having a ground voltage value, voltage V2 is a power supply voltage, e.g., a voltage corresponding to power supply source VDD discussed above with respect to FIGS. 1A and 1B, and voltage V1 is a supply voltage having a supply voltage value between the ground voltage value and a power supply voltage value of voltage V2. In various embodiments, reference voltage VR and voltages V1 and V2 have values other than those corresponding to FIGS. 13A-13E. For example, in some embodiments, reference voltage VR has the power supply voltage value, voltage V2 has the ground voltage value, and voltage V1 has a value between the supply voltage value and the ground voltage value.

In various embodiments, forward stage 1310 includes an amplifier, e.g., an operational amplifier, and/or a transistor, e.g., an NMOS or PMOS transistor or a BJT. Feedback network 1320 includes a transformer-coupled BPF, e.g., a transformer-coupled BPF 1320B-1320E depicted in a corresponding one of FIGS. 13B-13E and discussed below. By including the transformer-coupled BPF in feedback network 1320, oscillator 1300, e.g., one of oscillators 1300B-1300E, is configured to generate an AC output signal VOUT on output terminal OUT, output signal VOUT having a fast roll-off characteristic, i.e., one or more transmission zeroes, capable of suppressing high-order harmonics as further discussed below.

In the non-limiting examples depicted in FIGS. 13B-13E, each corresponding feedback oscillator 1300B-1300E includes a respective forward stage 1310B-1310E usable as forward stage 1310. Each forward stage 1310B-1310E includes a terminal A1 coupled to output terminal OUT, terminals A2 and A3, and a transistor M5 coupled between terminals A1-A3 in accordance with the various embodiments discussed below. In the embodiments depicted in FIGS. 13B-13E, transistor M5 is an NMOS transistor. In various embodiments, one or more of forward stages 1310B-1310E includes transistor M5 being a transistor other than an NMOS transistor, e.g., a PMOS transistor, an NPN BJT, or a PNP BJT. In various embodiments, one or more of forward stages 1310B-1310E includes one or more transistors (not shown), in addition to transistor M5, coupled between one or more of terminals A1-A3 and one or more of a drain or source terminal or gate of transistor M5.

Each transformer-coupled BPF 1320B-1320E included in the corresponding feedback oscillator 1300B-1300E includes terminals F1-F4, one or both of taps PT or ST, a transformer T3 coupled between terminals F1-F4 and taps PT and/or ST as discussed below, and a coupling device CD coupled between terminals F1 and F2. In various embodiments, one or more of transformer-coupled BPFs 1320B-1320E includes one or more transistors (not shown) coupled between transformer T3 and one or more of terminals F1-F4 and/or taps PT and/or ST. In each of the embodiments depicted in FIGS. 13B-13E, each of terminals F3 and F4 is coupled to reference node NR.

Transformer T3 corresponds to one of transformers 1500T-1800T depicted in FIGS. 15A-18B, and is represented collectively in the depictions of FIGS. 19A-21B discussed below. Transformer T3 includes a primary winding W5 coupled to a secondary winding W6. Winding W5 is coupled between terminals F1 and F3, and winding W6 is coupled between terminals F2 and F4. In various embodiments, transformer T3 includes one or both of tap PT electrically connected to winding W5 or tap ST electrically connected to winding W6. In various embodiments, tap PT is a center tap of winding W5 and/or tap ST is a center tap of winding W6.

Figure 13B:
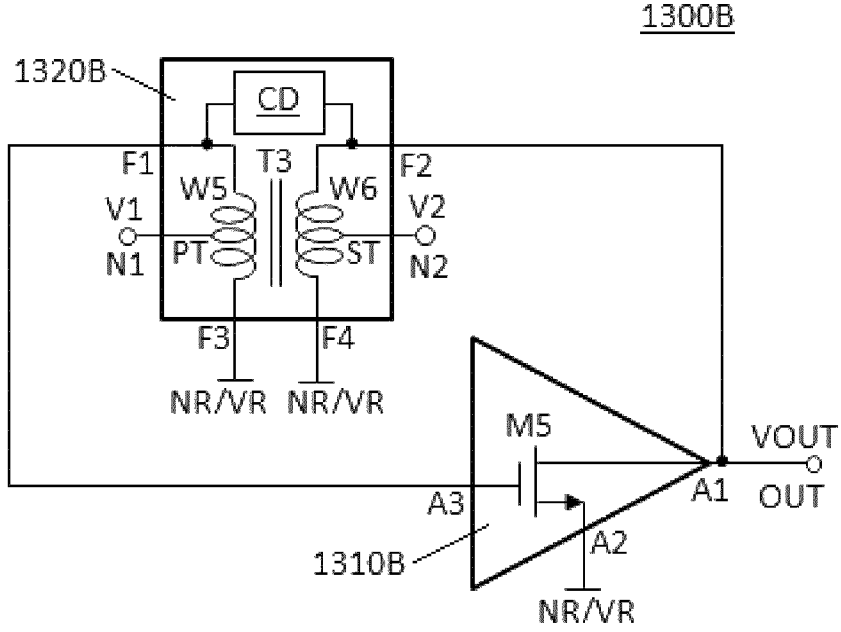

Feedback oscillator 1300B depicted in FIG. 13B, also referred to as a common-source feedback oscillator 1300B or a single-end common-source feedback oscillator 1300B in some embodiments, includes forward stage 1310B usable as forward stage 1310, transformer-coupled BPF 1320B usable as feedback network 1320, node N1, node N2, reference node NR, and output terminal OUT, each discussed above with respect to feedback oscillator 1300 and FIG. 13A.

As depicted in FIG. 13B, forward stage 1310B includes transistor M5 including a drain terminal coupled to terminal A1, a source terminal coupled to terminal A2, and a gate coupled to terminal A3. Terminal A2 is coupled to reference node NR, and terminal A3 is coupled to terminal F1 of transformer-coupled BPF 1320B. Transformer-coupled BPF 1320B also includes terminal F2 coupled to terminal A1 and output terminal OUT, coupling device CD coupled between terminals F1 and F2, and transformer T3 including tap PT coupled to node N1 and tap ST coupled to node N2, thereby having a configuration corresponding to that of transformer-coupled BPF 1700 discussed below with respect to FIGS. 17A and 17B.

By including forward stage 1310B and transformer-coupled BPF 1320B as depicted in FIG. 13B, feedback oscillator 1300B is configured to generate output signal VOUT on output terminal OUT having the benefits discussed above with respect to feedback oscillator 1300.

Figure 13C:
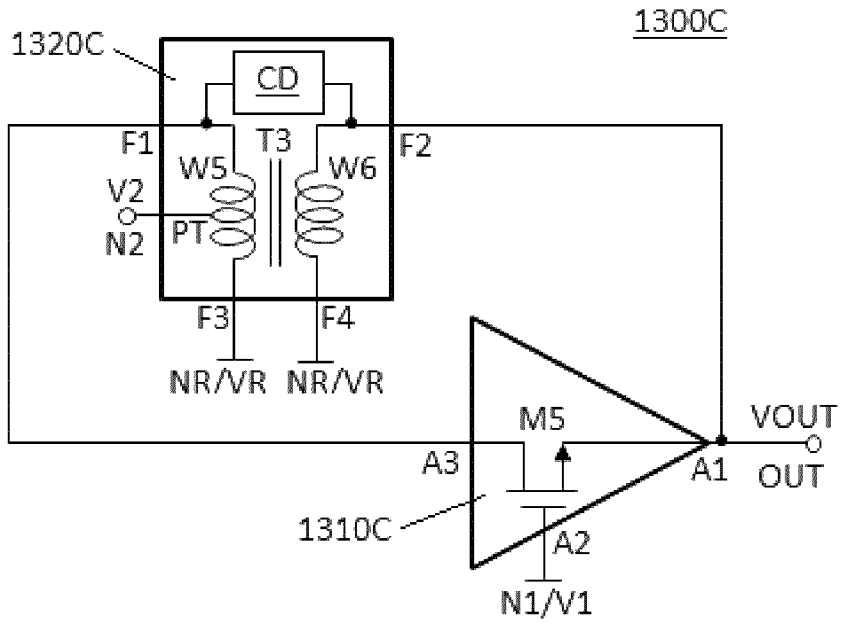

Feedback oscillator 1300C depicted in FIG. 13C, also referred to as a common-gate feedback oscillator 1300C or a single-end common-gate feedback oscillator 1300C in some embodiments, includes forward stage 1310C usable as forward stage 1310, transformer-coupled BPF 1320C usable as feedback network 1320, node N1, node N2, reference node NR, and output terminal OUT, each discussed above with respect to feedback oscillator 1300 and FIG. 13A.

As depicted in FIG. 13C, forward stage 1310C includes transistor M5 including the source terminal coupled to terminal A1, the gate coupled to terminal A2, and the drain terminal coupled to terminal A3. Terminal A2 is coupled to node N1, and terminal A3 is coupled to terminal F1 of transformer-coupled BPF 1320C. Transformer-coupled BPF 1320C also includes terminal F2 coupled to terminal A1 and output terminal OUT, coupling device CD coupled between terminals F1 and F2, and transformer T3 including tap PT coupled to node N2, thereby having a configuration corresponding to that of transformer-coupled BPF 1500 discussed below with respect to FIGS. 15A and 15B.

By including forward stage 1310C and transformer-coupled BPF 1320C as depicted in FIG. 13C, feedback oscillator 1300C is configured to generate output signal VOUT on output terminal OUT having the benefits discussed above with respect to feedback oscillator 1300.

Figure 13D:
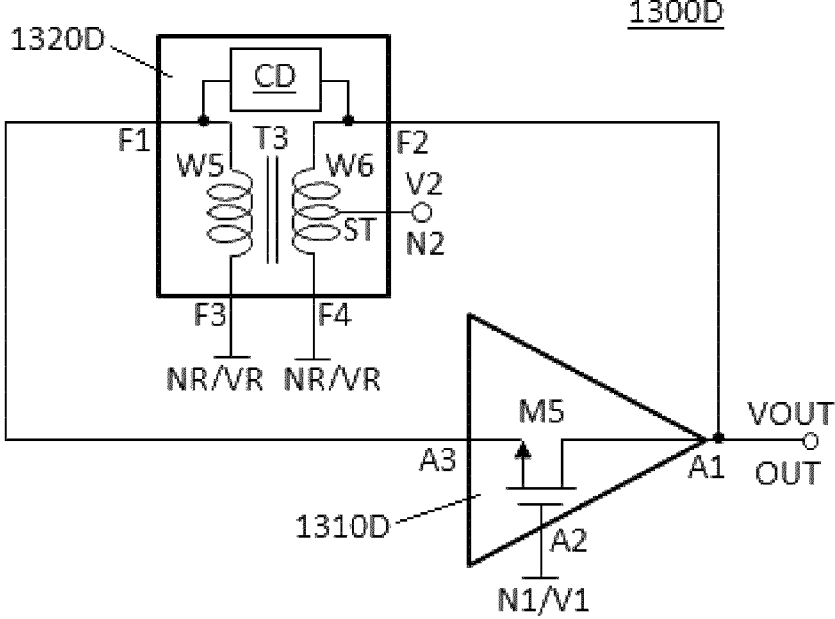

Feedback oscillator 1300D depicted in FIG. 13D, also referred to as a common-gate feedback oscillator 1300D or a single-end common-gate feedback oscillator 1300D in some embodiments, includes forward stage 1310D usable as forward stage 1310, transformer-coupled BPF 1320D usable as feedback network 1320, node N1, node N2, reference node NR, and output terminal OUT, each discussed above with respect to feedback oscillator 1300 and FIG. 13A.

As depicted in FIG. 13D, forward stage 1310D includes transistor M5 including the drain terminal coupled to terminal A1, the gate coupled to terminal A2, and the source terminal coupled to terminal A3. Terminal A2 is coupled to node N1, and terminal A3 is coupled to terminal F1 of transformer-coupled BPF 1320D. Transformer-coupled BPF 1320D also includes terminal F2 coupled to terminal A1 and output terminal OUT, coupling device CD coupled between terminals F1 and F2, and transformer T3 including tap ST coupled to node N2, thereby having a configuration corresponding to that of transformer-coupled BPF 1600 discussed below with respect to FIGS. 16A and 16B.

By including forward stage 1310D and transformer-coupled BPF 1320D as depicted in FIG. 13D, feedback oscillator 1300D is configured to generate output signal VOUT on output terminal OUT having the benefits discussed above with respect to feedback oscillator 1300.

Figure 13E:
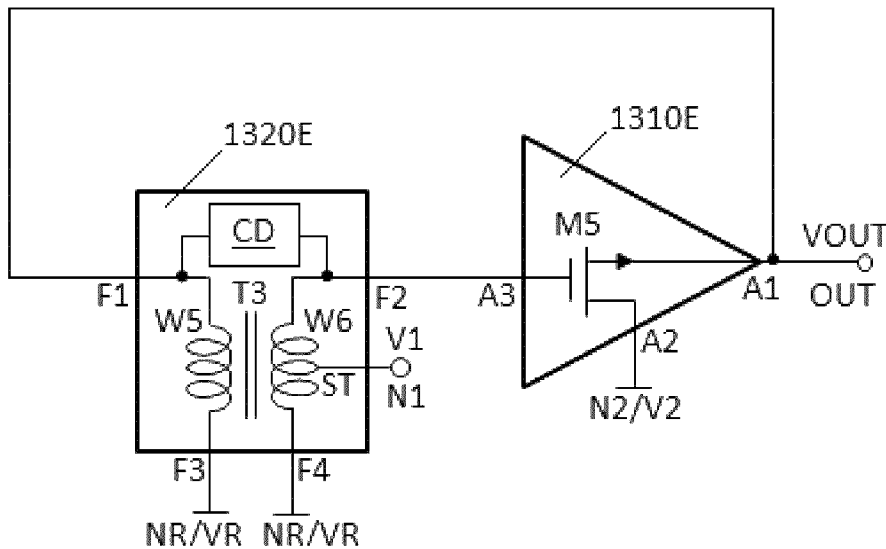

Feedback oscillator 1300E depicted in FIG. 13E, also referred to as a common-drain feedback oscillator 1300E or a single-end common-drain feedback oscillator 1300E in some embodiments, includes forward stage 1310E usable as forward stage 1310, transformer-coupled BPF 1320E usable as feedback network 1320, node N1, node N2, reference node NR, and output terminal OUT, each discussed above with respect to feedback oscillator 1300 and FIG. 13A.

As depicted in FIG. 13E, forward stage 1310E includes transistor M5 including the source terminal coupled to terminal A1, the drain terminal coupled to terminal A2, and the gate coupled to terminal A3. Terminal A2 is coupled to node N2, and terminal A3 is coupled to terminal F2 of transformer-coupled BPF 1320E. Transformer-coupled BPF 1320E also includes terminal F1 coupled to terminal A1 and output terminal OUT, coupling device CD coupled between terminals F1 and F2, and transformer T3 including tap ST coupled to node N1, thereby having a configuration corresponding to that of transformer-coupled BPF 1600 discussed below with respect to FIGS. 16A and 16B.

By including forward stage 1310E and transformer-coupled BPF 1320E as depicted in FIG. 13E, feedback oscillator 1300E is configured to generate output signal VOUT on output terminal OUT having the benefits discussed above with respect to feedback oscillator 1300.

FIGS. 14A and 14B are schematic diagrams of differential oscillators, in accordance with some embodiments. FIG. 14A is a block diagram of a feedback oscillator 1400, and FIG. 14B is a diagram of a differential oscillator 1400B, a non-limiting example of feedback oscillator 1400 in accordance with some embodiments.

As depicted in FIG. 14A, differential oscillator 1400 includes a transformer-coupled BPF 1420 and a differential circuit 1430. Transformer-coupled BPF 1420 is coupled to node NR, discussed above with respect to FIGS. 13A-13E, and each of transformer-coupled BPF 1420 and differential circuit 1430 is coupled between output nodes OUTP and OUTN. Transformer-coupled BPF 1420 and differential circuit 1430 are arranged in a parallel configuration, differential oscillator 1400 thereby being configured to generate a differential output signal as complementary signals VOUTP on output node OUTP and VOUTN on output node OUTN.

Transformer-coupled BPF 1420 includes transformer T3 including windings W5 and W6, coupling device CD, and terminals F1-F4, configured as discussed above with respect to transformer-coupled BPFs 1320B-1320E and FIGS. 13B-13E. Compared to transformer-coupled BPFs 1320B-1320E, transformer-coupled BPF 1420 does not include either of taps PT or ST in the embodiment depicted in FIGS. 14A and 14B and thereby has a configuration corresponding to that of transformer-coupled BPF 1800 discussed below with respect to FIGS. 18A and 18B. In various embodiments, transformer-coupled BPF 1420 includes one or both of taps PT or ST coupled to one or both of nodes N1 or N2 discussed above with respect to FIGS. 13A-13E, thereby having a configuration corresponding to that of one of transformer-coupled BPFs 1500-1700 discussed below with respect to FIGS. 15A-17B.

Differential circuit 1430 is an electronic circuit configured to drive signals VOUTP and VOUTN responsive to loading at respective output nodes OUTP and OUTN provided by transformer-coupled BPF 1420. In various embodiments, differential circuit 1430 includes one or more amplifiers, e.g., an operational amplifier, and/or transistors, e.g., an NMOS or PMOS transistor or a BJT, and one or more nodes configured to carry one or more of a power supply or reference voltage, e.g., VDD and/or a ground voltage. In various embodiments, differential circuit 1430 includes a cross-coupled configuration of one or more amplifiers and/or transistors and is thereby configured to generate signals VOUTP and VOUTN as complementary signals.

By including transformer-coupled BPF 1420 and differential circuit 1430 configured as discussed above, differential oscillator 1400 is capable of generating signals VOUTP and VOUTN as the differential output signal, controlled by transformer-coupled BPF 1420 in operation, such that the differential output signal has a fast roll-off characteristic, i.e., one or more transmission zeroes, capable of suppressing high-order harmonics as discussed above with respect to VCOs 1100A and 1100B and feedback oscillators 1300-1300E.

In the non-limiting example depicted in FIG. 14B, differential oscillator 1400B includes a differential circuit 1430B usable as differential circuit 1430. Differential circuit 1430B includes a transistor M6 cross-coupled with a transistor M7 between output nodes OUTP and OUTN. In the embodiment depicted in FIG. 14B, each of transistors M6 and M7 is a PMOS transistor and includes a source terminal coupled to node N1. In various embodiments, differential circuit 1430B includes transistors M6 and M7 being transistors other than PMOS transistors, e.g., NMOS transistors or NPN or PNP BJTs, and that include one or more terminals otherwise coupled to one or more of output nodes OUTP or OUTN or nodes N1, N2, or NR. In various embodiments, differential circuit 1430B includes one or more transistors (not shown), in addition to transistors M6 and M7, coupled between one or more terminals of transistors M6 and/or M7 and one or more of output nodes OUTP or OUTN or nodes N1, N2, or NR.

By including differential circuit 1430B and transformer-coupled BPF 1420 as depicted in FIG. 14B, differential oscillator 1400B is configured to generate signals VOUTP and VOUTN on respective output terminals OUTP and OUTN having the benefits discussed above with respect to differential oscillator 1400.

FIGS. 15A-18B are schematic diagrams of respective transformer-coupled BPFs 1500-1800, in accordance with some embodiments. FIGS. 15A-18A depict circuit diagrams and FIGS. 15B-18B depict layout diagrams of respective transformer-coupled BPFs 1500-1800. In accordance with various embodiments, transformer-coupled BPFs 1500-1800 are usable as transformer-coupled BPFs 1320B-1320E or 1420, discussed above with respect to FIGS. 13A-14B.

As depicted in FIGS. 15A-18B, transformer-coupled BPFs 1500-1800 include respective transformers 1500T-1800T and coupling device CD discussed above with respect to FIGS. 13A-14B. Each of transformers 1500T-1800T is an embodiment of transformer T3 discussed above with respect to FIGS. 13A-14B and further discussed below.

Figure 15A:
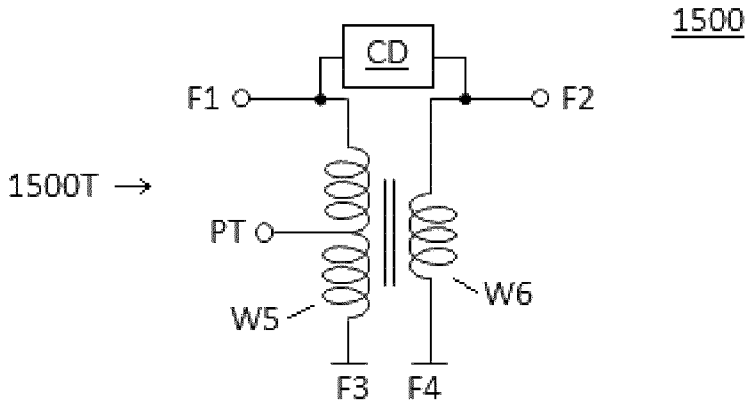

Each of FIGS. 15A-18A depicts transformers 1500T-1800T including terminals F1-F4, winding W5 coupled between terminals F1 and F3, and winding W6 coupled between terminals F2 and F4, and coupling device CD coupled between terminals F1 and F2. As depicted in FIG. 15A, transformer 1500T also includes tap PT electrically connected to winding W5. As depicted in FIG. 16A, transformer 1600T also includes tap ST electrically connected to winding W6. As depicted in FIG. 17A, transformer 1700T also includes tap PT electrically connected to winding W5 and tap ST electrically connected to winding W6.

Each of the layout diagrams depicted in FIGS. 15B-18B includes terminals F1-F4 and, if present, taps PT and/or ST. Terminals F1-F4 and taps PT and ST correspond to respective terminals 428, 426, 420, 422, 424, and 434 of coupled-transformer 400 and transformer-coupled BPFs 500-700 discussed above with respect to FIGS. 4-7.

Winding W5 (not labeled in FIGS. 15B-18B) corresponds to the conductive path between terminals F1/428 and F3/420, depicted as conductive structures 414, 412, and 406 and discussed above with respect to FIG. 4. Winding W6 (not labeled in FIGS. 15B-18B) corresponds to the conductive path between terminals F2/426 and F4/422, depicted as conductive structure 418 including extending portions 438 and discussed above with respect to FIG. 4.

Figure 15B:
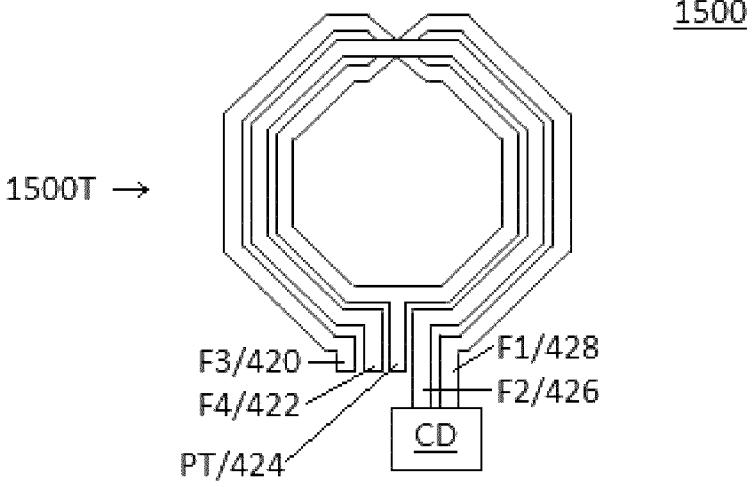
Figure 17A:
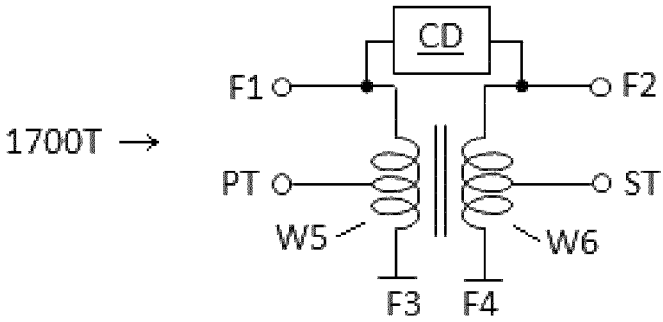
Figure 17B:
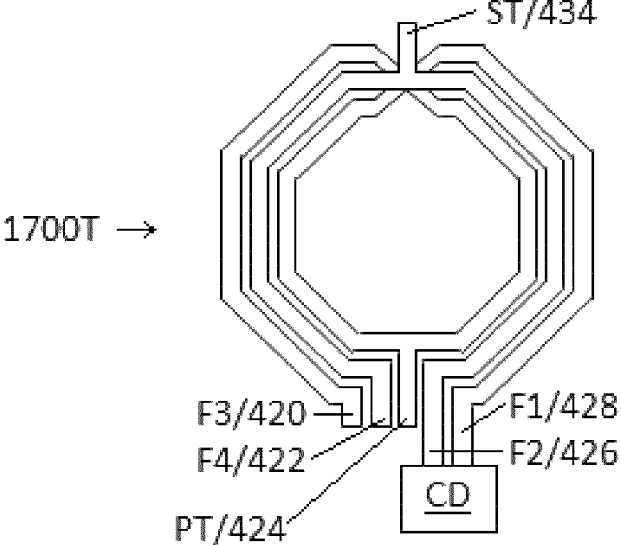
Figure 18A:
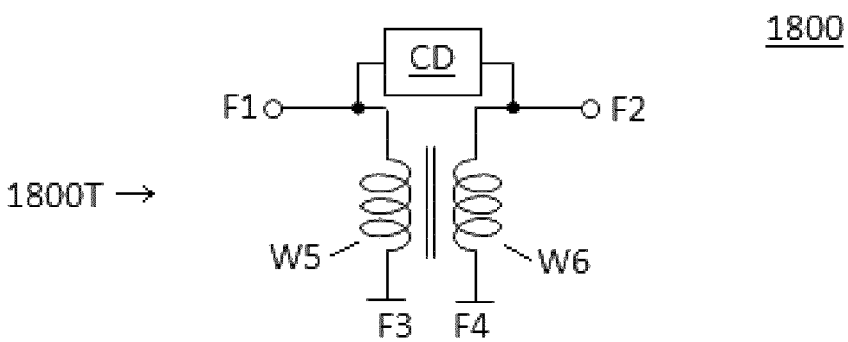
Figure 18B:
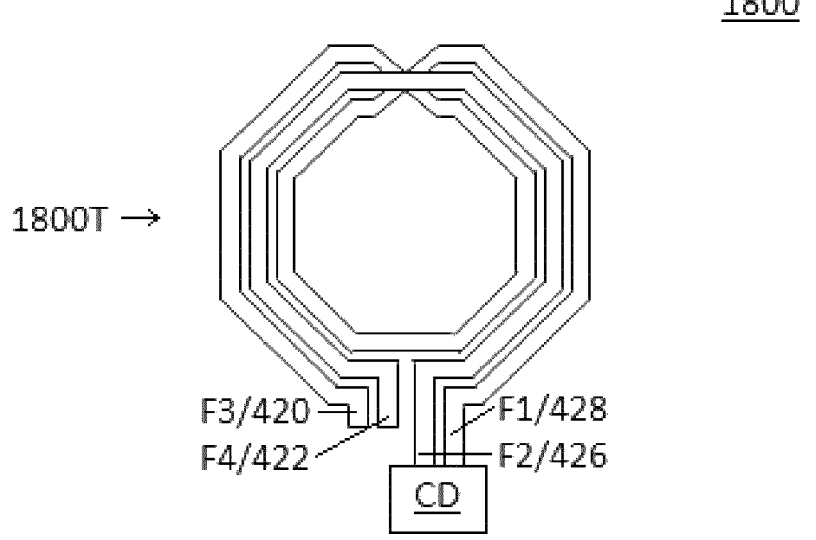

As depicted in FIGS. 15B and 17B, tap PT/424 of respective transformers 1500T and 1700T is electrically connected to winding W5 at a location midway along the conductive path between terminals F1/428 and F3/420 and corresponding to conductive structure 412 of FIG. 4, and is thereby configured as a center tap of winding W5. In various embodiments, tap PT is electrically connected to winding W5 at a location other than midway along the conductive path between terminals F1/428 and F3/420 and is thereby configured as a tap other than a center tap of winding W5.

Figure 16A:
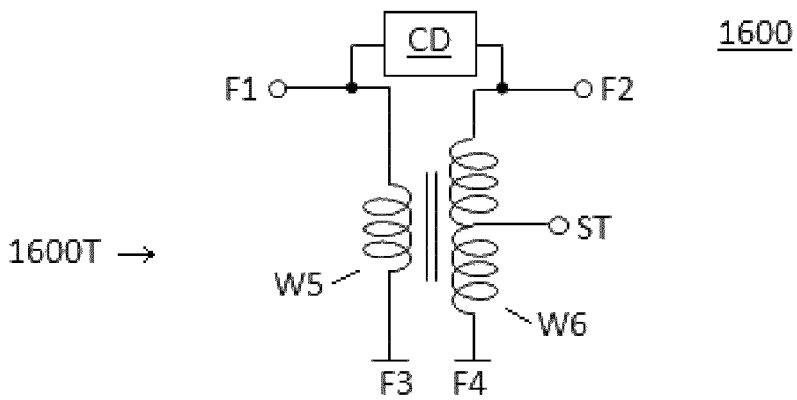
Figure 16B:
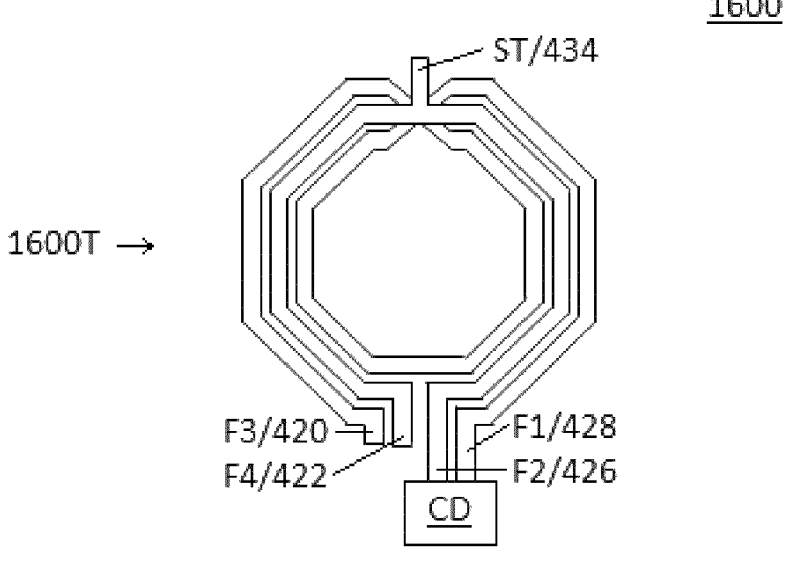

As depicted in FIGS. 16B and 17B, tap ST/434 of respective transformers 1600T and 1700T is electrically connected to winding W6 at a location midway along the conductive path between terminals F2/426 and F4/422 and corresponding to conductive structure 418 of FIG. 4, and is thereby configured as a center tap of winding W6. In various embodiments, tap ST is electrically connected to winding W6 at a location other than midway along the conductive path between terminals F2/426 and F4/422 and is thereby configured as a tap other than a center tap of winding W6.

By the configurations discussed above, each of transformer-coupled BPFs 1500-1800, used in an oscillator, e.g., one of feedback oscillators 1300-1300E or differential oscillators 1400 or 1400B, is capable of realizing the benefits discussed above with respect to feedback oscillators 1300-1300E and differential oscillators 1400 and 1400B.

FIGS. 19A-21B are schematic diagrams of respective transformer-coupled BPFs 1900-2100, in accordance with some embodiments. FIGS. 19A-21A depict circuit diagrams and FIGS. 19B-21B depict layout diagrams of respective transformer-coupled BPFs 1900-2100. In accordance with various embodiments, transformer-coupled BPFs 1900-2100 are usable as transformer-coupled BPFs 1320B-1320E or 1420, discussed above with respect to FIGS. 13A-14B.

As depicted in FIGS. 19A-21B, transformer-coupled BPFs 1900-2100 include transformer T3 and respective coupling devices 1900CD-2100CD. Transformer T3 is represented in FIGS. 19A-21B as optionally including various elements of the embodiments depicted in FIGS. 15A-18B as respective transformers 1500T-1800T, and each transformer-coupled BPF 1900-2100 is capable of being realized by including any one of transformers 1500T-1800T.

In various embodiments, one or more of transformer-coupled BPFs 1900-2100 includes a transformer other than transformer T3, e.g., transformer T1 or T2 discussed above with respect to FIGS. 1A-12B, and respective coupling devices 1900CD-2100CD. In various embodiments, coupling devices 1900CD-2100CD are usable as coupling devices CD1 and CD2 discussed above with respect to FIGS. 11A-12B and coupling device CD discussed above with respect to FIGS. 13A-18B.

Figure 19A:
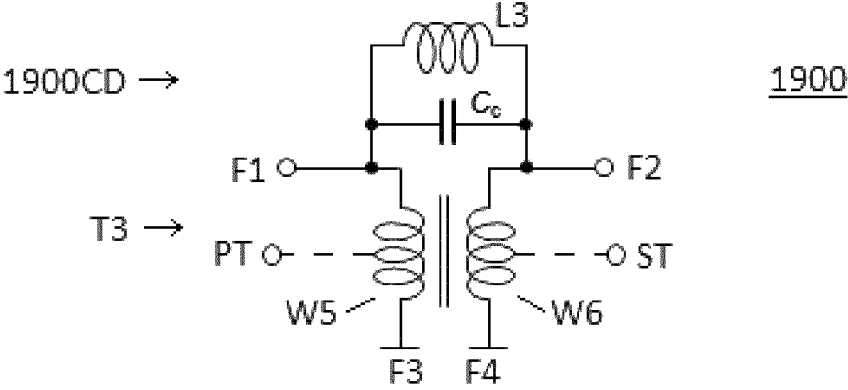
Figure 19B:
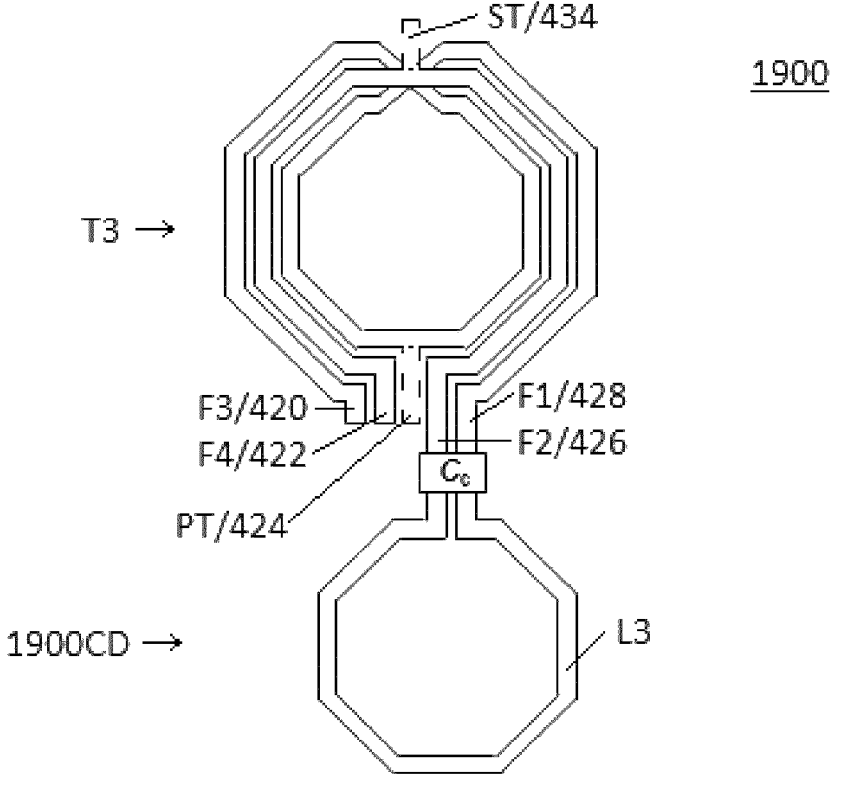
Figure 20A:
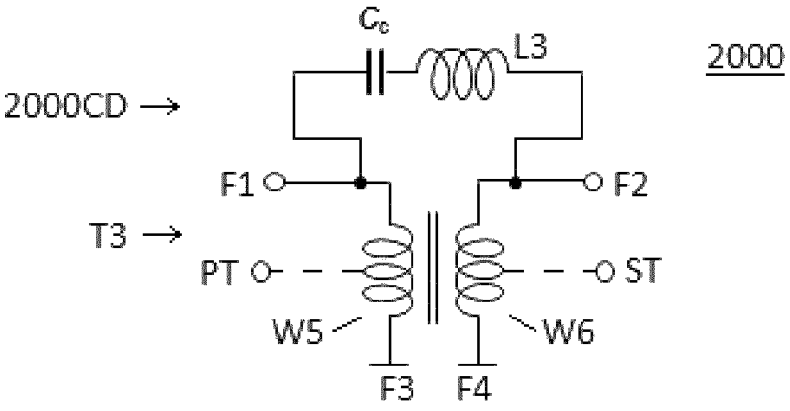
Figure 20B:
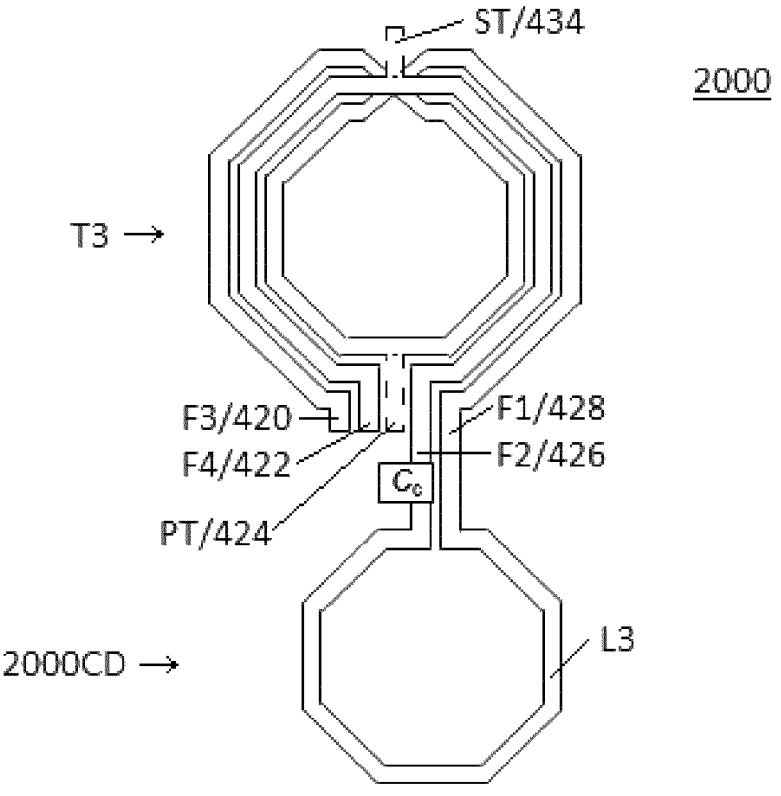
Figure 21A:
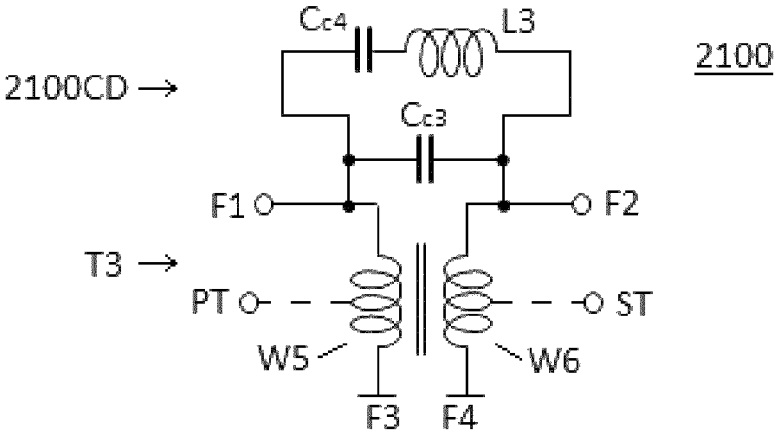
Figure 21B:
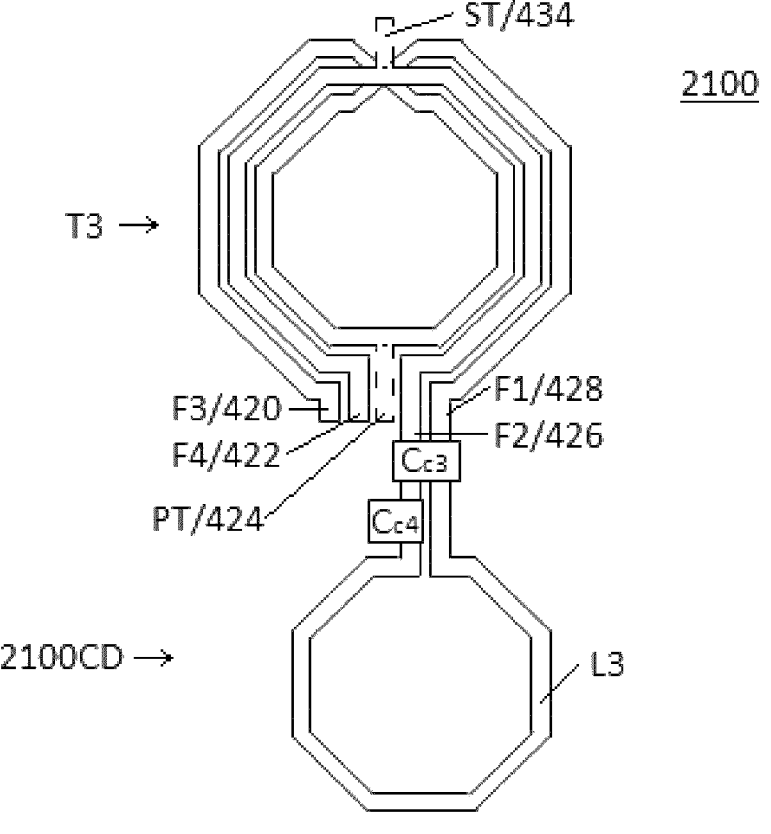

In the embodiment depicted in FIGS. 19A and 19B, coupling device 1900CD of transformer-coupled BPF 1900 includes a capacitive device Cc configured in parallel with an inductive device L3. In the embodiment depicted in FIGS. 20A and 20B, coupling device 2000CD of transformer-coupled BPF 2000 includes capacitive device Cc configured in series with inductive device L3. In the embodiment depicted in FIGS. 21A and 21B, coupling device 2100CD of transformer-coupled BPF 2100 includes a capacitive device Cc3 configured in parallel with a series combination of inductive device L3 and a capacitive device Cc4.

A capacitive device, e.g., capacitive device Cc, Cc3, or Cc4, is an IC structure configured to provide a targeted capacitance value between two or more terminals. In various embodiments, a capacitive device includes a plate capacitor, e.g., a MIM capacitor, a capacitor-configured MOS device, a variable capacitor, an adjustable capacitor, e.g., a MOSCAP, or another IC device suitable for providing a targeted capacitance value.

An inductive device, e.g., inductive device L3, is an IC structure configured to provide a targeted inductance value between two or more terminals. In various embodiments, an inductive device includes a single or multi-layer structure including one or more conductive, e.g., metallic, segments, having a geometry suitable for providing a targeted inductance value. In the embodiment depicted in FIGS. 19B-21B, inductive device L3 includes conductive segments having an octagonal shape, and is thereby configured to provide a targeted inductance value. In various embodiments, an inductive device includes conductive segments having another shape, e.g., a square, spiral or other suitable shape, and/or includes a transmission line, and is thereby configured to provide a targeted inductance value.

By including a transformer-coupled BPF including at least one coupling device, e.g., a transformer-coupled BPF 1500-2100 depicted in FIGS. 15A-21B, an oscillator, e.g., a feedback oscillator 1300-1300E or differential oscillator 1400 or 1400B, is capable of including a transmission zero configured to enhance 2nd and 3rd harmonic suppression, thereby improving a signal to noise ratio of a generated signal compared to other approaches. In embodiments in which a coupling device includes a variable capacitor, the oscillator is further capable of including the transmission zero as a tunable transition zero. In embodiments that include an inductive device and/or second coupling capacitor, the oscillator is further capable of including one or more additional transmission zeroes, thereby further improving the signal to noise ratio of the generated signal compared to other approaches.

FIG. 22 is a flowchart of a method 2200 of generating an oscillation signal, in accordance with some embodiments. Method 2200 is usable with an oscillator, e.g., VCO 1100A or 1100B, feedback oscillator 1300-1300E, or differential oscillator 1400 or 1400B, discussed above with respect to FIGS. 11A, 11B, and 13A-14B, and/or with a transformer-coupled BPF, e.g., transformer-coupled BPF 1500-2100 discussed above with respect to FIGS. 15A-21B.

The sequence in which the operations of method 2200 are depicted in FIG. 22 is for illustration only; the operations of method 2200 are capable of being executed in sequences that differ from that depicted in FIG. 22. In some embodiments, operations in addition to those depicted in FIG. 22 are performed before, between, during, and/or after the operations depicted in FIG. 22. In some embodiments, some or all of the operations of method 2200 are part of operating a circuit including an oscillator, e.g., a PLL including a VCO.

At operation 2210, in some embodiments, a DC voltage is received by a transformer-coupled BPF of an oscillator. Receiving the DC voltage includes receiving one or more of a power supply voltage, a bias voltage, a reference voltage, e.g., a ground voltage, or a logical state of a control or enable signal. In various embodiments, receiving the DC voltage by the transformer-coupled BPF includes receiving the voltage from the oscillator of from a circuit other than the oscillator.

In some embodiments, receiving the voltage by the transformer-coupled BPF includes receiving one or more of voltage source $V_G$ or power supply source VDD discussed above with respect to FIGS. 11A and 11B, or voltages V1 or V2 or reference voltage VR discussed above with respect to FIGS. 13A-14B.

In some embodiments, receiving the voltage by the transformer-coupled BPF of an oscillator includes receiving the voltage by one or more of transformer-coupled BPFs 1500-2100 discussed above with respect to FIGS. 15A-21B.

In some embodiments, receiving the voltage by the transformer-coupled BPF of an oscillator includes receiving the voltage by one or more of transformer-coupled BPFs 1106 or 1112 of VCOs 1100A or 1100B discussed above with respect to FIGS. 11A and 11B, transformer-coupled BPFs 1320-1320E of feedback oscillators 1300-1300E discussed above with respect to FIGS. 13-13E, or transformer-coupled BPF 1420 of differential oscillators 1400 or 1400B discussed above with respect to FIGS. 14A and 14B.

In some embodiments, receiving the voltage by the transformer-coupled BPF of an oscillator includes receiving one or more additional voltages by one or more components of the oscillator in addition to the transformer-coupled BPF. In some embodiments, receiving the voltage by the transformer-coupled BPF of an oscillator includes receiving one or more of voltage power source $V_{BUF}$, or control voltages $V_{ctrl1}$ or $V_{ctrl2}$ by resonator 1102 of VCOs 1100A or 1100B discussed above with respect to FIGS. 11A and 11B. In some embodiments, receiving the voltage by the transformer-coupled BPF of an oscillator includes receiving one or more of voltages V1 or V2 or reference voltage VR by one or more of forward stage 1310-1310E or differential circuit 1430 or 1430B discussed above with respect to FIGS. 13A-14B.

At operation 2220, in response to the applied DC voltage, the oscillator generates an oscillation signal. Generating the oscillation signal includes generating the oscillation signal using the transformer-coupled BPF of the oscillator. In various embodiments, generating the oscillation signal includes generating the oscillation signal using one or more of transformer-coupled BPFs 1500-2100 discussed above with respect to FIGS. 15A-21B.

In various embodiments, generating the oscillation signal includes generating a complementary pair of signals or a standalone signal. In various embodiments, generating the oscillation signal includes the oscillator generating the oscillation signal at a pair of output terminals of the oscillator or at a single output terminal of the oscillator.

In some embodiments, generating the oscillation signal includes using transformer-coupled BPF 1106 or 1112 to control the drain terminals of transistors M1 and M2 of VCO 1100A or 1100B as discussed above with respect to FIGS. 11A-12B. In some embodiments, generating the oscillation signal includes generating signal VOUT at output terminal OUT as discussed above with respect to FIGS. 13A-13E. In some embodiments, generating the oscillation signal includes generating signals VOUTN at output terminal OUTN and VOUTP at output terminal OUTP as discussed above with respect to FIGS. 14A and 14B.

By executing some or all of the operations of method 2200, an oscillator generates an oscillation signal having enhanced 2nd and 3rd harmonic suppression compared to other approaches, thereby obtaining the benefits discussed above with respect to VCOs 1100A and 1100B, feedback oscillators 1300-1300E, differential oscillators 1400 and 1400B, and transformer-coupled BPFs 1500-2100.

In some embodiments, a VCO includes a power supply source, a voltage source, a reference voltage node, first and second transistors, each including a source terminal coupled to the reference voltage node, and first through fourth conductive structures. The first conductive structure includes a first terminal coupled to the power supply source, a first extending portion coupled between the first terminal and a drain terminal of the first transistor, and a second extending portion coupled between the first terminal and a drain terminal of the second transistor, and the second conductive structure includes a second terminal coupled to the voltage source, a third extending portion coupled in series with the third conductive structure between the second terminal and a gate of the first transistor, and a fourth extending portion coupled in series with the fourth conductive structure between the second terminal and a gate of the second transistor. In some embodiments, the VCO includes a first capacitive device coupled between the drain terminal of the first transistor and the gate of one of the first transistor or the second transistor and a second capacitive device coupled between the drain terminal of the second transistor and the gate of the other of the first transistor or the second transistor. In some embodiments, the VCO includes a first inductive device coupled in parallel with the first capacitive device between the drain terminal of the first transistor and the gate of the one of the first transistor or the second transistor, and a second inductive device coupled in parallel with the second capacitive device between the drain terminal of the second transistor and the gate of the other of the first transistor or the second transistor. In some embodiments, the VCO includes a first inductive device coupled in series with the first capacitive device between the drain terminal of the first transistor and the gate of the one of the first transistor or the second transistor, and a second inductive device coupled in series with the second capacitive device between the drain terminal of the second transistor and the gate of the other of the first transistor or the second transistor. In some embodiments, the VCO includes a third capacitive device coupled in parallel with the series combination of the first inductive device and the first capacitive device between the drain terminal of the first transistor and the gate of the one of the first transistor or the second transistor, and a fourth capacitive device coupled in parallel with the series combination of the second inductive device and the second capacitive device between the drain terminal of the second transistor and the gate of the other of the first transistor or the second transistor. In some embodiments, the second terminal is coupled to a metal layer and has a first width, the metal layer has a second width, and a ratio of the first width to the second width is greater than or equal to eight. In some embodiments, the VCO includes a first capacitive device coupled between the first extending portion and a first control voltage source, a second capacitive device coupled between the second extending portion and the first control voltage source, a third capacitive device coupled between the third conductive structure and a second control voltage source, and a fourth capacitive device coupled between the fourth conductive structure and the second control voltage source. In some embodiments, the VCO includes a capacitive device coupled between the first terminal and the reference voltage node.

In some embodiments, a VCO includes a power supply source, a voltage source, a reference voltage node, first and second transistors, each comprising a source terminal coupled to the reference voltage node, and first through fourth conductive structures. The first conductive structure includes a first terminal coupled to the power supply source, a first extending portion coupled between the first terminal and a drain terminal of the first transistor, and a second extending portion coupled between the first terminal and a drain terminal of the second transistor, the second conductive structure includes a second terminal coupled to the voltage source, a third extending portion coupled in series with the third conductive structure between the second terminal and a gate of the first transistor, and a fourth extending portion coupled in series with the fourth conductive structure between the second terminal and a gate of the second transistor, the first extending portion is positioned between the fourth extending portion and the third conductive structure, and the second extending portion is positioned between the third extending portion and the fourth conductive structure. In some embodiments, the third extending portion and the third conductive structure share a first electrical connection below the first terminal, and the fourth extending portion and the fourth conductive structure share a second electrical connection below the first terminal. In some embodiments, the first extending portion includes a third terminal adjacent to the second terminal, the second extending portion includes a fourth terminal adjacent to the second terminal, the third conductive structure includes a fifth terminal adjacent to the third terminal, and the fourth conductive structure includes a sixth terminal adjacent to the fourth terminal. In some embodiments, the VCO includes a first capacitive device coupled between the third terminal and one of the fifth terminal or the sixth terminal and a second capacitive device coupled between the fourth terminal and the other of the fifth terminal or the sixth terminal. In some embodiments, the VCO includes a first inductive device coupled in parallel with the first capacitive device between the third terminal and the one of the fifth terminal or the sixth terminal and a second inductive device coupled in parallel with the second capacitive device between the fourth terminal and the other of the fifth terminal or the sixth terminal. In some embodiments, the VCO includes a first inductive device coupled in series with the first capacitive device between the third terminal and the one of the fifth terminal or the sixth terminal, and a second inductive device coupled in series with the second capacitive device between the fourth terminal and the other of the fifth terminal or the sixth terminal. In some embodiments, the VCO includes a third capacitive device coupled in parallel with the series combination of the first inductive device and the first capacitive device between the third terminal and the one of the fifth terminal or the sixth terminal, and a fourth capacitive device coupled in parallel with the series combination of the second inductive device and the second capacitive device between the fourth terminal and the other of the fifth terminal or the sixth terminal. In some embodiments, each of the second through sixth terminals has a first width, the second terminal is coupled to a metal layer having a second width, and a ratio of the first width to the second width is greater than or equal to eight.

In some embodiments, a method of operating a VCO includes receiving a reference voltage at a source terminal of each of a first transistor and a second transistor, receiving a power supply voltage at a first terminal of a first conductive structure, wherein the first conductive structure includes a first extending portion coupled between the first terminal and a drain terminal of the first transistor and a second extending portion coupled between the first terminal and a drain terminal of the second transistor, and receiving an input voltage at a second terminal of a second conductive structure, wherein the second conductive structure includes a third extending portion coupled in series with a third conductive structure between the second terminal and a gate of the first transistor and a fourth extending portion coupled in series with a fourth conductive structure between the second terminal and a gate of the second transistor. In some embodiments, the method includes capacitively coupling the drain of the first transistor to the gate of the second transistor, and capacitively coupling the drain of the second transistor to the gate of the first transistor. In some embodiments, the method includes capacitively coupling the drain of the first transistor to the gate of the first transistor, and capacitively coupling the drain of the second transistor to the gate of the second transistor. In some embodiments, receiving the input voltage at the second terminal of the second conductive structure includes receiving the input voltage at the second terminal having a first width and being coupled to a metal layer having a second width, and a ratio of the first width to the second width is greater than or equal to eight.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A voltage-controlled oscillator (VCO) comprising:
a power supply source;
a voltage source;
a reference voltage node;
first and second transistors, each comprising a source terminal coupled to the reference voltage node; and
first through fourth conductive structures,
wherein
the first conductive structure comprises:
a first terminal coupled to the power supply source;
a first extending portion coupled between the first terminal and a drain terminal of the first transistor; and
a second extending portion coupled between the first terminal and a drain terminal of the second transistor,
and
the second conductive structure comprises:
a second terminal coupled to the voltage source;
a third extending portion coupled in series with the third conductive structure between the second terminal and a gate of the first transistor; and
a fourth extending portion coupled in series with the fourth conductive structure between the second terminal and a gate of the second transistor.

2. The VCO of claim 1, further comprising:
a first capacitive device coupled between the drain terminal of the first transistor and the gate of one of the first transistor or the second transistor; and
a second capacitive device coupled between the drain terminal of the second transistor and the gate of the other of the first transistor or the second transistor.

3. The VCO of claim 2, further comprising:
a first inductive device coupled in parallel with the first capacitive device between the drain terminal of the first transistor and the gate of the one of the first transistor or the second transistor; and
a second inductive device coupled in parallel with the second capacitive device between the drain terminal of the second transistor and the gate of the other of the first transistor or the second transistor.

4. The VCO of claim 2, further comprising:
a first inductive device coupled in series with the first capacitive device between the drain terminal of the first transistor and the gate of the one of the first transistor or the second transistor; and
a second inductive device coupled in series with the second capacitive device between the drain terminal of the second transistor and the gate of the other of the first transistor or the second transistor.

5. The VCO of claim 4, further comprising:
a third capacitive device coupled in parallel with the series combination of the first inductive device and the first capacitive device between the drain terminal of the first transistor and the gate of the one of the first transistor or the second transistor; and
a fourth capacitive device coupled in parallel with the series combination of the second inductive device and the second capacitive device between the drain terminal of the second transistor and the gate of the other of the first transistor or the second transistor.

6. The VCO of claim 1, wherein
the second terminal is coupled to a metal layer and has a first width,

24 the metal layer has a second width, and
a ratio of the first width to the second width is greater than or equal to eight.

7. The VCO of claim 1, further comprising:
a first capacitive device coupled between the first extending portion and a first control voltage source;
a second capacitive device coupled between the second extending portion and the first control voltage source;
a third capacitive device coupled between the third conductive structure and a second control voltage source; and
a fourth capacitive device coupled between the fourth conductive structure and the second control voltage source.

8. The VCO of claim 1, further comprising:
a capacitive device coupled between the first terminal and the reference voltage node.

9. A voltage-controlled oscillator (VCO) comprising:
a power supply source;
a voltage source;
a reference voltage node;
first and second transistors, each comprising a source terminal coupled to the reference voltage node; and
first through fourth conductive structures,
wherein
the first conductive structure comprises:
a first terminal coupled to the power supply source;
a first extending portion coupled between the first terminal and a drain terminal of the first transistor; and
a second extending portion coupled between the first terminal and a drain terminal of the second transistor,
the second conductive structure comprises:
a second terminal coupled to the voltage source;
a third extending portion coupled in series with the third conductive structure between the second terminal and a gate of the first transistor; and
a fourth extending portion coupled in series with the fourth conductive structure between the second terminal and a gate of the second transistor,
the first extending portion is positioned between the fourth extending portion and the third conductive structure, and
the second extending portion is positioned between the third extending portion and the fourth conductive structure.

10. The VCO of claim 9, wherein
the third extending portion and the third conductive structure share a first electrical connection below the first terminal, and
the fourth extending portion and the fourth conductive structure share a second electrical connection below the first terminal.

11. The VCO of claim 9, wherein
the first extending portion comprises a third terminal adjacent to the second terminal,
the second extending portion comprises a fourth terminal adjacent to the second terminal,
the third conductive structure comprises a fifth terminal adjacent to the third terminal, and
the fourth conductive structure comprises a sixth terminal adjacent to the fourth terminal.

12. The VCO of claim 11, further comprising:
a first capacitive device coupled between the third terminal and one of the fifth terminal or the sixth terminal; and a second capacitive device coupled between the fourth terminal and the other of the fifth terminal or the sixth terminal.

13. The VCO of claim 12, further comprising:

a first inductive device coupled in parallel with the first capacitive device between the third terminal and the one of the fifth terminal or the sixth terminal; and a second inductive device coupled in parallel with the second capacitive device between the fourth terminal and the other of the fifth terminal or the sixth terminal.

14. The VCO of claim 12, further comprising:

a first inductive device coupled in series with the first capacitive device between the third terminal and the one of the fifth terminal or the sixth terminal; and a second inductive device coupled in series with the second capacitive device between the fourth terminal and the other of the fifth terminal or the sixth terminal.

15. The VCO of claim 14, further comprising:

a third capacitive device coupled in parallel with the series combination of the first inductive device and the first capacitive device between the third terminal and the one of the fifth terminal or the sixth terminal; and a fourth capacitive device coupled in parallel with the series combination of the second inductive device and the second capacitive device between the fourth terminal and the other of the fifth terminal or the sixth terminal.

16. The VCO of claim 11, wherein each of the second through sixth terminals has a first width, the second terminal is coupled to a metal layer having a second width, and a ratio of the first width to the second width is greater than or equal to eight.

17. A method of operating a voltage-controlled oscillator (VCO), the method comprising:

receiving a reference voltage at a source terminal of each of a first transistor and a second transistor;

receiving a power supply voltage at a first terminal of a first conductive structure, wherein the first conductive structure comprises:

a first extending portion coupled between the first terminal and a drain terminal of the first transistor; and a second extending portion coupled between the first terminal and a drain terminal of the second transistor; and receiving an input voltage at a second terminal of a second conductive structure, wherein the second conductive structure comprises:

a third extending portion coupled in series with a third conductive structure between the second terminal and a gate of the first transistor; and a fourth extending portion coupled in series with a fourth conductive structure between the second terminal and a gate of the second transistor.

18. The method of claim 17, further comprising:

capacitively coupling the drain of the first transistor to the gate of the second transistor; and capacitively coupling the drain of the second transistor to the gate of the first transistor.

19. The method of claim 17, further comprising:

capacitively coupling the drain of the first transistor to the gate of the first transistor; and capacitively coupling the drain of the second transistor to the gate of the second transistor.

20. The method of claim 17, wherein the receiving the input voltage at the second terminal of the second conductive structure comprises receiving the input voltage at the second terminal having a first width and being coupled to a metal layer having a second width, and a ratio of the first width to the second width is greater than or equal to eight.

* * * * *